US012716939B2

(12) United States Patent
Paul et al.

(10) Patent No.: US 12,716,939 B2
(45) Date of Patent: Aug. 25, 2026

(54) FAIL-SAFE AND HIGH VOLTAGE TOLERANT TEST CONTROL CIRCUITRY FOR AN INTEGRATED CIRCUIT (IC)

(71) Applicant: STMicroelectronics International N.V., Geneva (CH)

(72) Inventors: Rik Paul, Kolkata (IN); Rajesh Narwal, Greater Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 156 days.

(21) Appl. No.: 18/829,754

(22) Filed: Sep. 10, 2024

(65) Prior Publication Data

US 2026/0072076 A1 Mar. 12, 2026

(51) Int. Cl.
*G01R 31/28* (2006.01)
*H02H 9/04* (2006.01)

(52) U.S. Cl.
CPC ........... *G01R 31/2884* (2013.01); *H02H 9/04* (2013.01)

(58) Field of Classification Search
CPC ............ G01R 31/2884; G01R 31/2896; G01R 31/2851; G01R 31/26; G01R 31/2601; G01R 31/2607; H02H 9/04
See application file for complete search history.

(56) References Cited

U.S. PATENT DOCUMENTS

| | | | | |
|---|---|---|---|---|
| 6,405,148 | B1 * | 6/2002 | Hayashi | G01R 31/2834 463/41 |
| 9,391,618 | B2 | 7/2016 | Benzer | |
| 2009/0089605 | A1 | 4/2009 | Westwick et al. | |
| 2015/0212144 | A1 * | 7/2015 | Ouyang | H10P 74/273 324/762.01 |
| 2017/0059645 | A1 * | 3/2017 | Pan | G01R 31/2621 |
| 2020/0292610 | A1 * | 9/2020 | Pakala | G01R 31/2633 |
| 2021/0098314 | A1 * | 4/2021 | Ebiike | G01R 31/2621 |
| 2021/0249084 | A1 | 8/2021 | Yamada | |
| 2023/0268023 | A1 | 8/2023 | Betser et al. | |
| 2024/0072803 | A1 | 2/2024 | Kumar et al. | |
| 2024/0097668 | A1 * | 3/2024 | Xu | H03K 17/063 |

* cited by examiner

*Primary Examiner* — Alvaro E Fortich
(74) *Attorney, Agent, or Firm* — Alston & Bird LLP

(57) ABSTRACT

An example circuit and an electrical system utilizing test control circuitry to manage the transmission of electrical test signals between an integrated circuit and a main board are provided. The circuit includes test control circuitry configured to selectively transmit electrical test signals between an IC and a pad interface based on a plurality of asynchronous electrical supplies, at least one of which exceeds a maximum voltage rating of the test control circuitry. The test control circuitry includes first and second switching stage circuitry enabling electrical flow through the circuit based on first and second asynchronous electrical supply voltages. Intermediate biasing circuitry further defines an intermediate voltage between the first switching stage circuitry and the second switching stage circuitry. Protective circuitry is configured to ensure a voltage difference across any two terminals of a particular transistor does not exceed a particular maximum voltage rating associated with the particular transistor.

20 Claims, 12 Drawing Sheets

FAIL-SAFE AND HIGH VOLTAGE TOLERANT TEST CONTROL CIRCUITRY FOR AN INTEGRATED CIRCUIT (IC)

TECHNOLOGICAL FIELD

Embodiments of the present disclosure relate generally test control circuitry, and more particularly, to test control circuitry including a plurality of asynchronous control signals.

BACKGROUND

Analog integrated circuits (IC), including intellectual property (IP) cores, generally implement test modes which transmit and receive signals to facilitate the test, debug, and/or tuning of internal critical voltages and current. Test control circuitry is often placed between the contact pad of the IC under test and the test switching connections internal to the IC to determine the transmission of electrical test signals to and from the IC. When enabled, the test control circuitry allows voltages/currents to be passed from the components of the IC to the contact pad interface and vice versa based on the operating test procedure.

Applicant has identified many technical challenges and difficulties associated with the transmission of electrical test signals using test control circuitry. Through applied effort, ingenuity, and innovation, Applicant has solved problems related to the transmission of electrical test signals by developing solutions embodied in the present disclosure, which are described in detail below.

BRIEF SUMMARY

Various embodiments are directed to an example circuit and an electrical system utilizing test control circuitry to manage the transmission of electrical test signals between an integrated circuit and a main board. An example circuit may comprise test control circuitry configured to selectively transmit one or more electrical test signals between an integrated circuit (IC) and a pad interface based on a plurality of asynchronous electrical supplies. The test control circuitry comprising first switching stage circuitry, second switching stage circuitry, and intermediate biasing circuitry. The first switching stage circuitry configured to enable electrical flow through the first switching stage circuitry based on a first asynchronous electrical supply comprising a first asynchronous electrical supply voltage. The second switching stage circuitry configured to enable electrical flow through the second switching stage circuitry based on a second asynchronous electrical supply comprising a second asynchronous electrical supply voltage. The intermediate biasing circuitry configured to define an intermediate voltage between the first switching stage circuitry and the second switching stage circuitry. The test control circuitry comprises a plurality of transistors each having a maximum voltage rating. At least one of the plurality of asynchronous electrical supplies exhibits a maximum voltage exceeding the maximum voltage rating of all of the plurality of transistors. The test control circuitry further comprises protective circuitry configured to ensure a voltage difference across any two terminals of a particular transistor does not exceed a particular maximum voltage rating associated with the particular transistor.

In some embodiments, a second maximum voltage of the second asynchronous electrical supply is greater than a first maximum voltage of the first asynchronous electrical supply.

In some embodiments, the test control circuitry comprises a maximum voltage rating threshold based at least in part on the maximum voltage rating.

In some embodiments, the protective circuitry comprises floating supply circuitry configured to generate a floating supply voltage and floating ground circuitry configured to generate a floating ground voltage, wherein the floating supply voltage and the floating ground voltage are configured to protect one or more biasing transistors comprising the intermediate biasing circuitry.

In some embodiments, the floating supply voltage is based at least in part on the second asynchronous electrical supply.

In some embodiments, in an instance in which the second asynchronous electrical supply voltage is greater than the maximum voltage rating threshold, the floating supply voltage is between 51% and 55% of the second asynchronous electrical supply voltage.

In some embodiments, the intermediate biasing circuitry generates a first intermediate voltage based at least in part on the floating supply voltage.

In some embodiments, the floating ground voltage is based at least in part on the second asynchronous electrical supply.

In some embodiments, in an instance in which the second asynchronous electrical supply voltage is greater than the maximum voltage rating threshold, the floating ground voltage is between 45% and 49% of the second asynchronous electrical supply voltage.

In some embodiments, the intermediate biasing circuitry generates a second intermediate voltage based at least in part on the floating ground voltage.

In some embodiments, the example circuit may further comprise floating voltage modifier circuitry configured to generate a modified floating supply voltage and a modified floating ground voltage based at least in part on the floating supply voltage, the floating ground voltage, and a pad interface voltage received at an electrical connection between the test control circuitry and the pad interface.

In some embodiments, in an instance in which the first asynchronous electrical supply and the second asynchronous electrical supply are both at or near 0 volts, the modified floating supply voltage is between 51% and 55% of the pad interface voltage, and the modified floating ground voltage is between 45% and 49% of the pad interface voltage.

In some embodiments, the example circuit may further comprise maximum selector circuitry configured to generate a modified second asynchronous electrical supply based at least in part on the second asynchronous electrical supply voltage, the pad interface voltage, and the modified floating ground voltage.

In some embodiments, the maximum selector circuitry is further configured to generate a modified complementary second asynchronous electrical supply based at least in part on the second asynchronous electrical supply voltage, the pad interface voltage, the modified floating ground voltage, and the modified floating supply voltage.

In some embodiments, the second switching stage circuitry includes a first transistor configured to receive the modified second asynchronous electrical supply, and a complement transistor configured to receive the modified complementary second asynchronous electrical supply.

In some embodiments, the protective circuitry comprises first stage protection circuitry configured to protect the first transistor of the second switching stage circuitry.

In some embodiments, the protective circuitry comprises second stage protection circuitry configured to protect the complement transistor comprising the second switching stage circuitry.

In some embodiments, the protective circuitry further comprises level shifting circuitry configured to protect one or more first switching stage transistors comprising the first switching stage circuitry.

In some embodiments, the level shifting circuitry is configured to generate a level shifted output voltage based at least in part on the first asynchronous electrical supply voltage and the modified floating supply voltage and wherein the level shifted output voltage is transmitted to the one or more charge protection transistors positioned between the first switching stage circuitry and the intermediate biasing circuitry.

An electrical system comprising a main board, a pad interface, and test control circuitry is further provided. The pad interface configured to provide a conductive interface between the main board and an integrated circuit (IC). The test control circuitry configured to selectively transmit one or more electrical test signals between the IC and the pad interface based on a first asynchronous electrical supply and a second asynchronous electrical supply. The test control circuitry comprising first switching stage circuitry, second switching stage circuitry, and intermediate biasing circuitry. The first switching stage circuitry configured to enable electrical flow through the first switching stage circuitry based on the first asynchronous electrical supply. The second switching stage circuitry configured to enable electrical flow through the second switching stage circuitry based on the second asynchronous electrical supply. The intermediate biasing circuitry configured to define an intermediate voltage between the first switching stage circuitry and the second switching stage circuitry. The test control circuitry comprises a plurality of transistors each having a maximum voltage rating. The second asynchronous electrical supply exhibits a maximum voltage exceeding the maximum voltage rating of all of the plurality of transistors. The test control circuitry further comprises protective circuitry configured to ensure a voltage difference across any two terminals of a particular transistor does not exceed a particular maximum voltage associated with the particular transistor.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Figure 1:
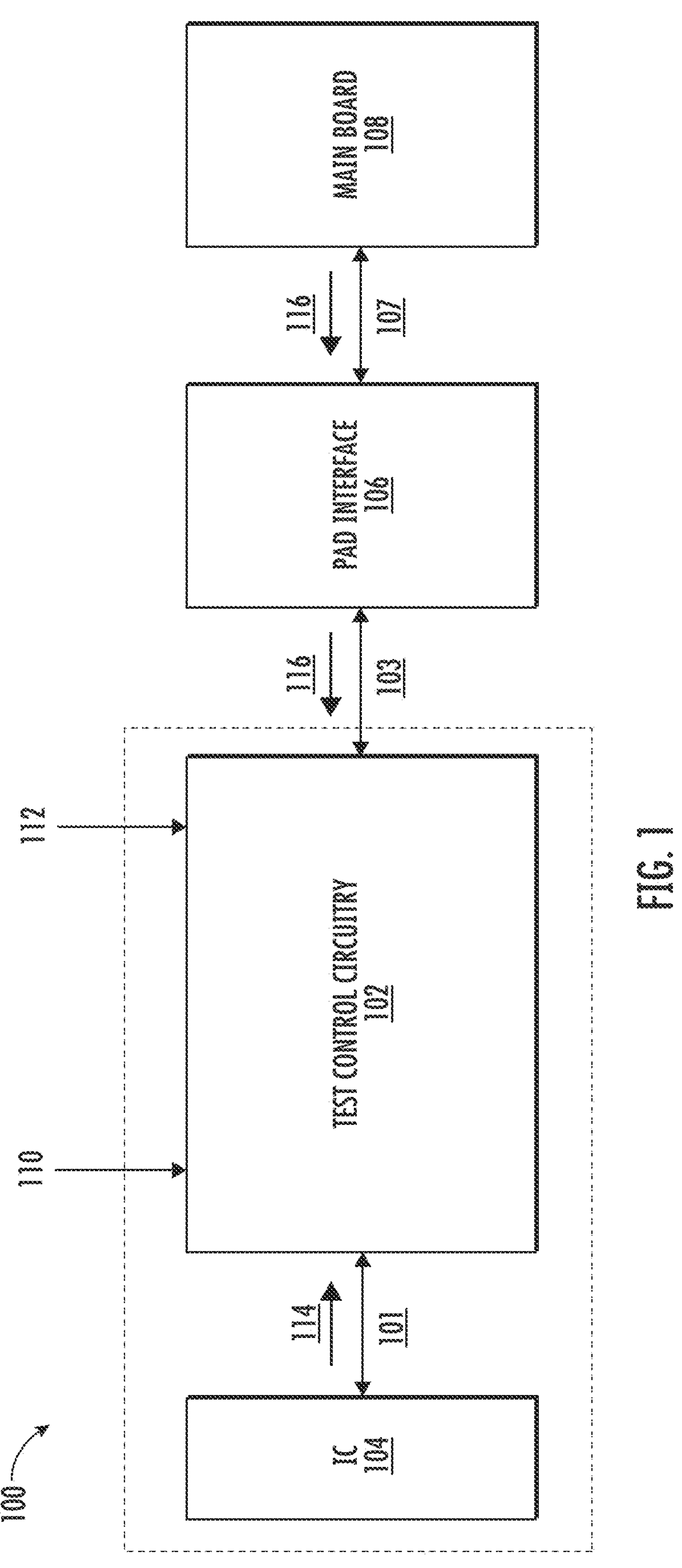
FIG. 1 depicts a block diagram of an example IC test system in accordance with an example embodiment of the present disclosure.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

The term "high voltage" as used herein may refer to a voltage of an electrical signal exceeding a voltage rating of one or more electrical components. As a non-limiting example, high voltage may refer to a voltage greater than 1.8 volts.

Various example embodiments address technical problems associated with managing the transmission of electrical test signals between an IC and a conductive pad interface. As understood by those of skill in the field to which the present disclosure pertains, there are numerous example scenarios in which electrical test signals may be transmitted between an IC and a conductive pad interface.

Analog ICs generally implement test modes which transmit and receive signals to facilitate the test, debug, and/or tuning of internal critical voltages and current. Test control circuitry is often placed between the conductive pad of the IC under test and the test switching connections internal to the IC to manage the transmission of electrical test signals to and from the IC. When enabled, the test control circuitry allows voltages/currents to be passed from the components of the IC to the contact pad interface and vice versa based on the operating test procedure. By accessing the voltages/currents and/or setting voltages/currents in the IC, a main board may determine the operational state of the IC under test.

Many ICs include multiple independent power supply sources. For example, an IC may include an IC specific power supply and an external input/output supply (e.g., IO supply). The test mux may be dependent on both the IC power supply and the external IO supply. For example, the transmission of electrical test signals may not be permitted until both power supplies are configured to enable the test mode. Since each of the power supplies operate independently, each power supply can be set to any value in the operating range at any time (including asynchronously). Further, some power supplies may be configured to operate at a high voltage (e.g., 3.6 volts) exceeding the voltage rating of the electrical components comprising the test control circuitry.

The asynchronous nature of the power supplies combined with the high voltages may be damaging to the internal components of the test control circuitry. For example, the test control circuitry may comprise transistors with a low voltage rating (e.g., 1.0 volts or 1.8 volts). An electrical component may be damaged or destroyed in an instance in which the voltage across any of the terminals of the electrical component exceeds the voltage rating of the electrical component. Thus, with asynchronous power supply sources and voltages exceeding the voltage rating of the electrical components of the test control circuitry, the test control circuitry may be damaged.

Further complications may arise in an instance in which the IC enters a fail-safe mode. In some ICs a fail-safe mode may cause the external IO power supply and the IC power supply to fall to 0 volts, while the power received from the contact pad power supply continues to provide power to the IC. The test control circuitry described herein may be resilient to such a fail-safe mode, even in an instance in which the pad interface voltage exceeds the maximum voltage rating of one or more of the electrical components comprising the test control circuitry.

Various previous examples enact various techniques to deal with the damage caused to the electrical components of test control circuitry. For example, a designer may utilize electrical components having an electrical voltage rating exceeding the maximum voltage of the various supply voltages. However, electrical components having large maximum voltage ratings may be bulky and expensive to manufacture. Some applications may not be conducive to electrical components having high electrical voltage ratings. A designer may choose to limit the voltage levels at an IC to low voltage levels (e.g., 1.0 volts or 1.8 volts). However, more and more applications are implementing high voltage circuitry. Some electrical systems may require the test control circuitry to be compatible with high voltages (3.6 volts).

Referring now to FIG. 1, an example IC test system 100 is provided. As depicted in FIG. 1, the example IC test system 100 includes test control circuitry 102 electrically connected to an IC 104 and configured to receive one or more electrical test signals 114 from the IC 104 on conductor 101. As further depicted in FIG. 1, the test control circuitry 102 is electrically connected to a pad interface 106 providing an electrical connection to an external main board 108. The test control circuitry 102 receives a pad interface voltage 116 provided by the main board 108 through the pad interface 106 by conductor 103 and conductor 107. As further depicted in FIG. 1, the test control circuitry 102 is configured to receive a first asynchronous electrical supply 110 (e.g., IC power supply) and a second asynchronous electrical supply 112 (e.g., IO power supply).

As depicted in FIG. 1, the test control circuitry 102 manages the transmission of electrical signals between the main board 108 through the pad interface 106 and the IC 104 based on the first asynchronous electrical supply 110 and the second asynchronous electrical supply 112. For example, the test control circuitry 102 may enable electrical flow through the test control circuitry 102 in an instance in which a test enable signal is indicated by both the first asynchronous electrical supply 110 and the second asynchronous electrical supply 112. Once electrical flow is enabled through the test control circuitry 102 a number of test operations may be performed by the main board 108 in coordination with the IC 104.

For example, the test control circuitry 102 may interface with test switching connections internal to the IC 104. The test switching connections may be selectively programmed to provide various electrical signals correlated with various parts of the IC 104. The main board 108 or other electrical device may determine the operation of the IC 104 based on the electrical test signals 114 read from the IC 104.

Further, the main board 108 or other electrical device may transmit various test currents/voltages through the pad interface 106 to the IC 104 in an instance in which the test control circuitry 102 is enabled to allow electrical flow. Based on the transmitted test currents/voltages and electrical test signals 114 returned by the IC 104 through the test control circuitry 102, the main board 108 or other electrical device may further determine the operation of the IC 104.

In some embodiments, the test control circuitry 102 may be integrated with the IC 104. For example, the test control circuitry 102 may be included on the same substrate as the IC 104.

Figure 2:
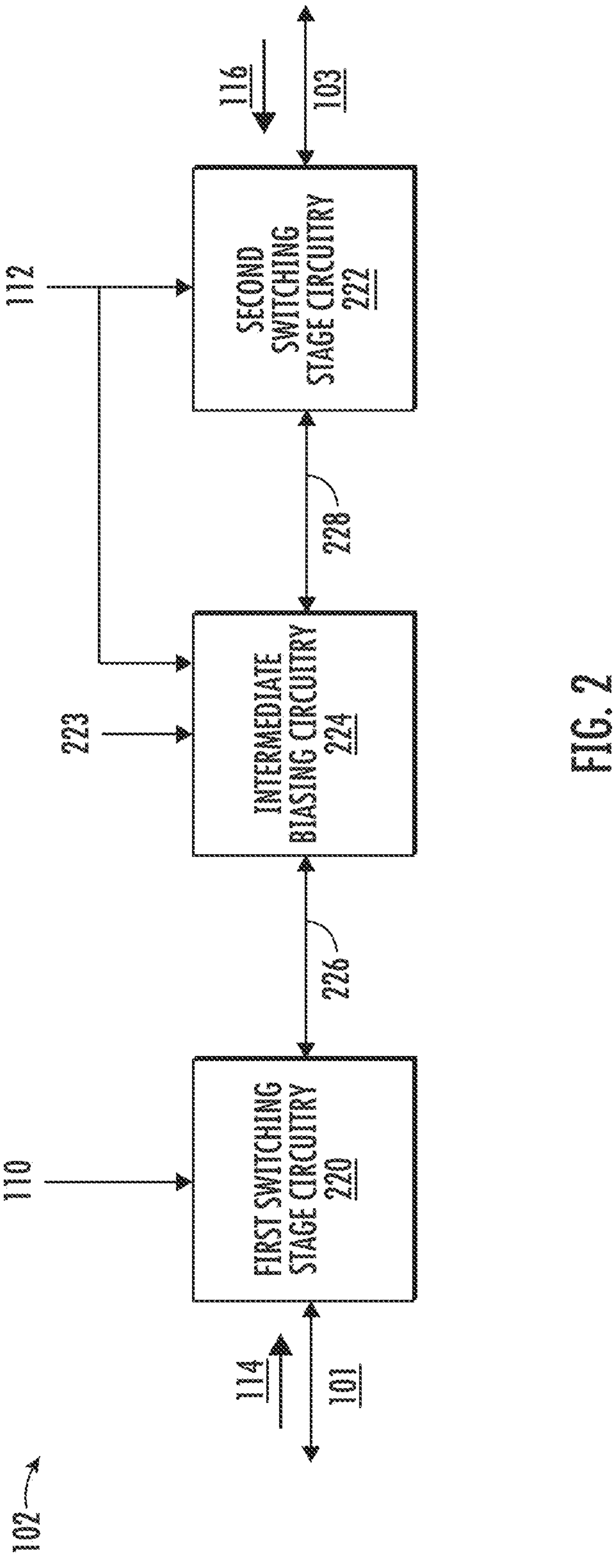
FIG. 2 depicts an example block diagram of test control circuitry in accordance with an example embodiment of the present disclosure.

Referring now to FIG. 2, a block diagram depicting example test control circuitry 102 is provided. As depicted in FIG. 2, the example test control circuitry 102 includes first switching stage circuitry 220 configured to receive the first asynchronous electrical supply 110 and the electrical test signals 114, for example, from the IC 104 (as shown in FIG. 1). As further depicted in FIG. 2, the example test control circuitry 102 includes second switching stage circuitry 222 configured to receive the second asynchronous electrical supply 112 and the pad interface voltage 116, for example, from the main board 108 (as shown in FIG. 1). The example test control circuitry 102 further includes intermediate biasing circuitry 224 electrically connected between the first switching stage circuitry 220 and the second switching stage circuitry 222.

As depicted in FIG. 2, the example test control circuitry 102 includes first switching stage circuitry 220. The first switching stage circuitry 220 is configured to enable electrical flow through the first switching stage circuitry 220 based on the first asynchronous electrical supply 110. For example, in some embodiments, a logic 0 provided by the first asynchronous electrical supply 110 may enable the first switching stage circuitry 220, allowing electrical flow through the first switching stage circuitry 220. Thus, a voltage/current present at the conductor 226 may be passed to the IC 104 by conductor 101. Similarly, an electrical test signal 114 transmitted by the IC 104 may be transmitted through the first switching stage circuitry 220 to the conductor 226.

As further depicted in FIG. 2, the example first switching stage circuitry 220 is enabled based on the first asynchronous electrical supply 110. The first asynchronous electrical supply 110 is any electrical signal dictating the state of the first switching stage circuitry 220. For example, in an enabled state, the switching components within the first switching stage circuitry 220 are closed, enabling electrical flow through the first switching stage circuitry 220. Conversely, in a disabled state, the switching components within the first switching stage circuitry 220 are open, preventing electrical flow through the first switching stage circuitry 220. In some embodiments, the first asynchronous electrical supply 110 may represent a logical value, for example, a logic 1, or a logic 0. In some embodiments, a logic 0 may enable the first switching stage circuitry 220. In some embodiments, a logic 1 may enable the first switching stage circuitry 220.

Although the first asynchronous electrical supply 110 may represent a logic value, the first asynchronous electrical supply 110 exhibits a voltage. For example, a logic 0 may be represented by a voltage at or near 0 volts and a logic 1 may be represented by a voltage at or near 1.8 volts, 3.3 volts, 3.6 volts, and so on. As described herein, the first asynchronous electrical supply 110 may refer to the local IC supply voltage, as such, the first asynchronous electrical supply 110 may exhibit a voltage complying with the maximum voltage rating of the various electrical components comprising the test control circuitry 102. As a non-limiting example, the maximum voltage of the first asynchronous electrical supply 110 may be at or near 1.8 volts.

As further depicted in FIG. 2, the example test control circuitry 102 includes second switching stage circuitry 222. The second switching stage circuitry 222 is configured to enable electrical flow through the second switching stage circuitry 222 based on the second asynchronous electrical supply 112. For example, in some embodiments, a logic 0 provided by the second asynchronous electrical supply 112 may enable the second switching stage circuitry 222, allowing electrical flow through the second switching stage circuitry 222. Thus, a voltage/current present at the conductor 228 may be passed to the pad interface 106. Similarly, a pad interface voltage 116 transmitted by the main board through conductor 103 may be transmitted through the second switching stage circuitry 222 to the conductor 228.

As further depicted in FIG. 2, the example second switching stage circuitry 222 is enabled based on the second asynchronous electrical supply 112. The second asynchronous electrical supply 112 is any electrical signal dictating the state of the second switching stage circuitry 222. For example, in an enabled state, the switching components within the second switching stage circuitry 222 are closed, enabling electrical flow through the second switching stage circuitry 222. Conversely, in a disabled state, the switching components within the second switching stage circuitry 222 are open, preventing electrical flow through the second switching stage circuitry 222. In some embodiments, the second asynchronous electrical supply 112 may represent a logical value, for example, a logic 1, or a logic 0. In some embodiments, a logic 0 may enable the second switching stage circuitry 222. In some embodiments, a logic 1 may enable the second switching stage circuitry 222.

Although the second asynchronous electrical supply 112 may represent a logic value, the second asynchronous electrical supply 112 exhibits a voltage. For example, a logic 0 may be represented by a voltage at or near 0 volts and a logic 1 may be represented by a voltage at or near 1.8 volts, 3.3 volts, 3.6 volts, and so on. As described herein, the second asynchronous electrical supply 112 may refer to an external IO supply voltage, as such, the second asynchronous electrical supply 112 may not comply with the maximum voltage ratings of the various electrical components comprising the test control circuitry 102. For example, the maximum voltage of the second asynchronous electrical supply 112 may be at or near 3.6 volts while the maximum voltage rating of the electrical components of the test control circuitry 102 is, for example, 1.8 volts.

As further depicted in FIG. 2, the second switching stage circuitry 222 interfaces with the conductor 103. The pad interface voltage 116 may be transmitted by the main board 108 as depicted in relation to FIG. 1 on the conductor 103. Thus, the pad interface voltage 116 may exceed the maximum voltage rating of the various electrical components comprising the second switching stage circuitry 222. For example, in some embodiments, the pad interface voltage 116 may exhibit a maximum voltage at or near 3.6 volts.

Figure 4A:
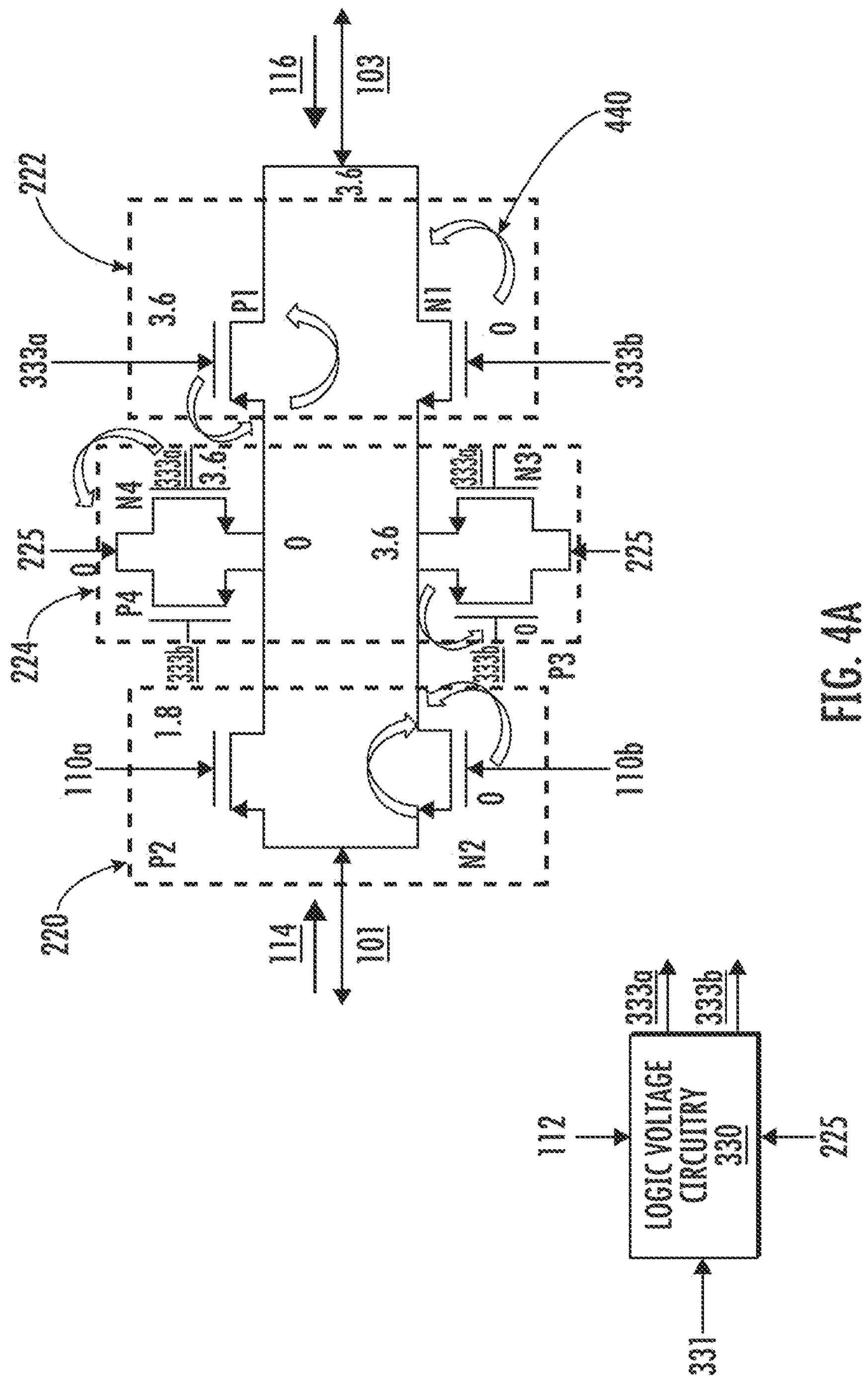
FIG. 4A-FIG. 4B depict example stresses on an example circuit designed in accordance with an example embodiment of the present disclosure.
Figure 4B:
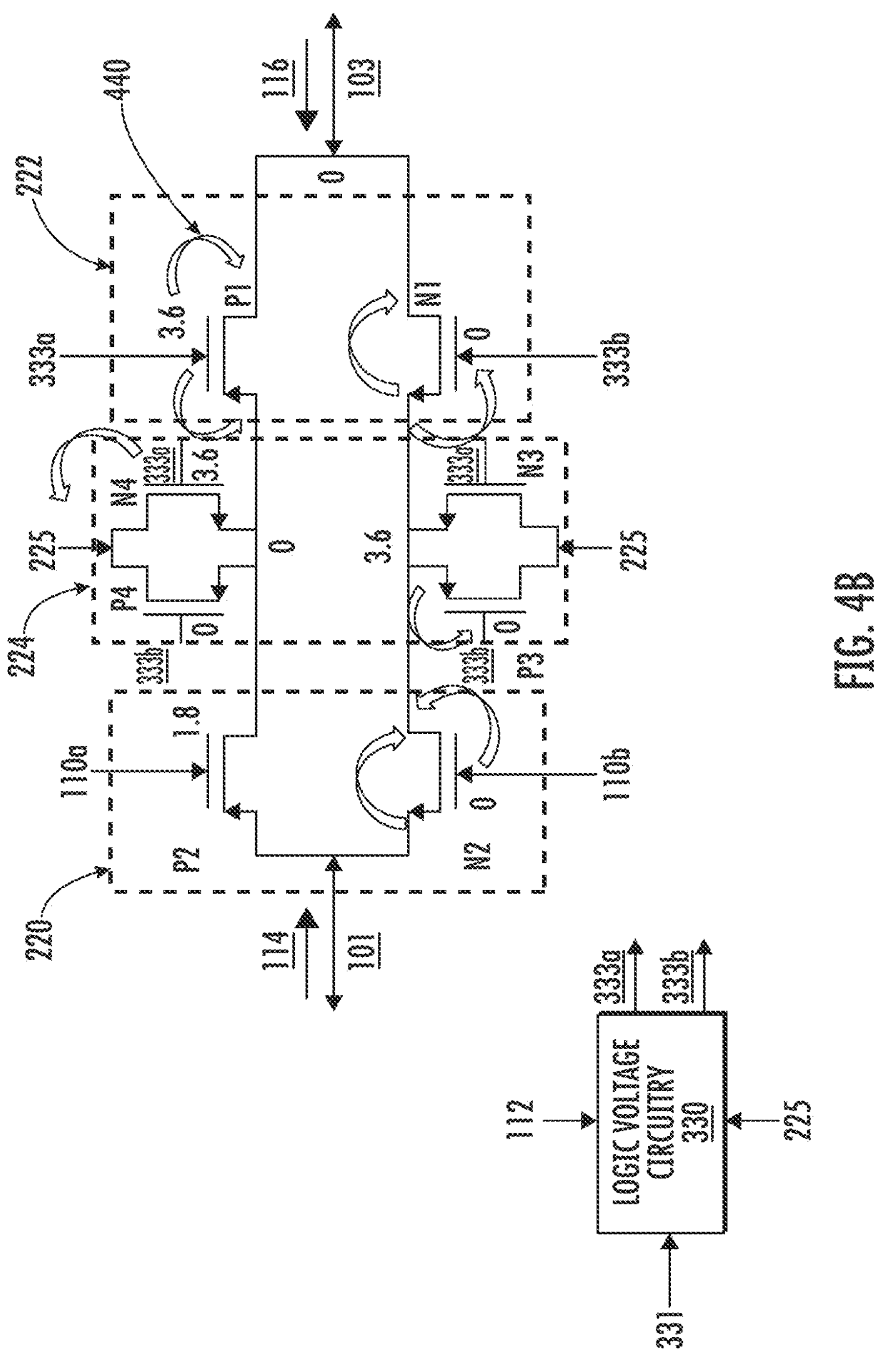

Because the voltage of the second asynchronous electrical supply 112 and the voltage of the pad interface voltage 116 may exceed the maximum voltage rating of the various electrical components comprising the test control circuitry 102, the voltage difference across terminals of the various electrical components comprising the test control circuitry 102 may exceed the maximum voltage rating of the components, causing stress on the electrical components. In addition, the asynchronous nature of the first asynchronous electrical supply 110, the second asynchronous electrical supply 112, and the pad interface voltage 116 may cause further stresses on the electrical components of the test control circuitry 102. Example scenarios applying stress to electrical components of the test control circuitry 102 are depicted in FIG. 4A-FIG. 4B.

Figure 3:
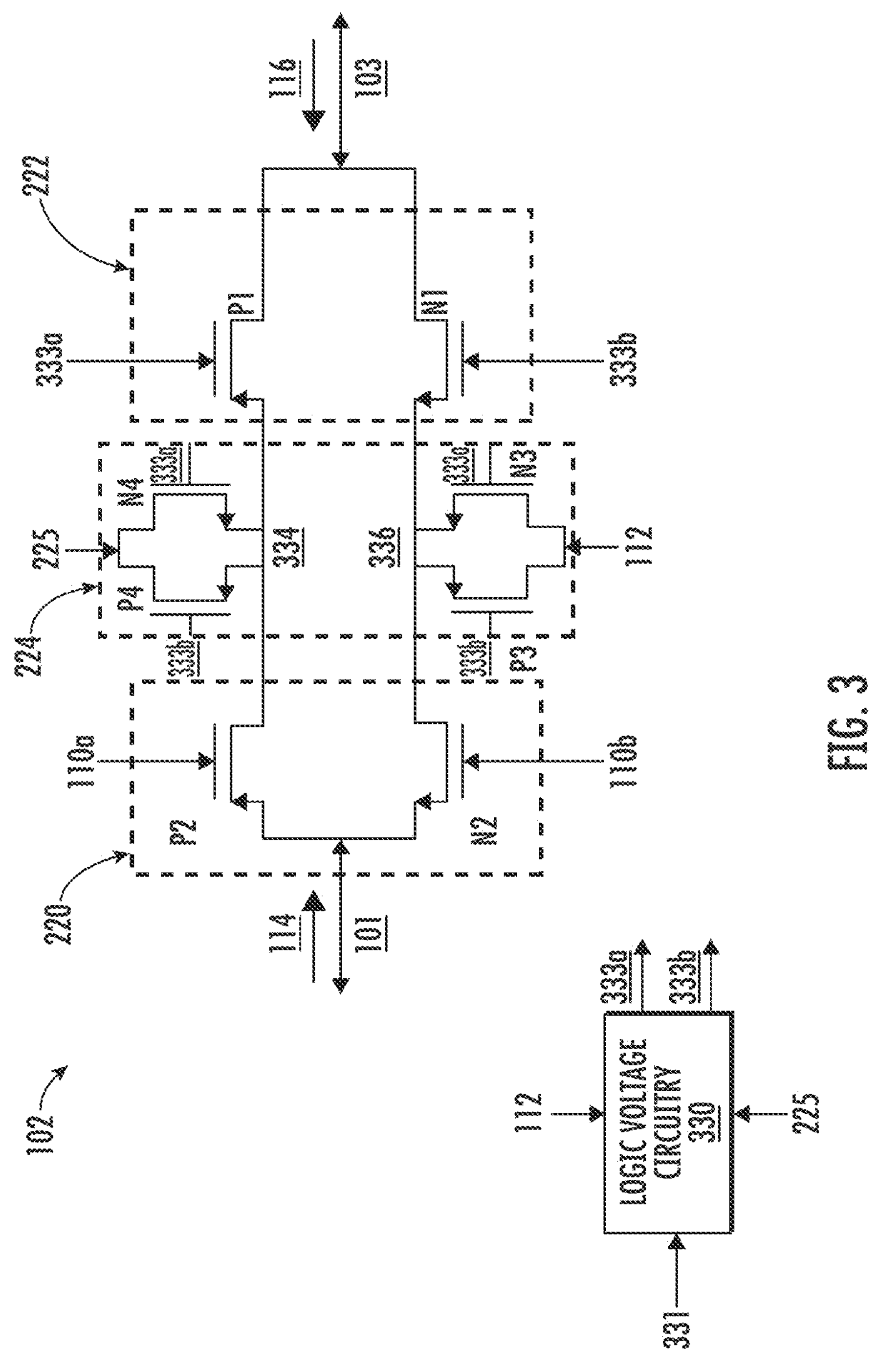
FIG. 3 depicts an example circuit diagram comprising test control circuitry in accordance with an example embodiment of the present disclosure.

Referring now to FIG. 3, and example embodiment of test control circuitry 102 is provided. As depicted in FIG. 3, the example test control circuitry 102 includes first switching stage circuitry 220, second switching stage circuitry 222, and intermediate biasing circuitry 224. As further depicted in FIG. 3, the test control circuitry 102 includes logic voltage circuitry 330 configured to generate a logic output 333*a*, and the complementary logic output 333*b* based on a logic input 331, a ground 225 (or negative supply voltage), and the second asynchronous electrical supply 112.

As depicted in FIG. 3, the example test control circuitry 102 includes logic voltage circuitry 330. The logic voltage circuitry 330 includes any circuitry including hardware and/or software configured to generate a logic output 333*a* and a complementary logic output 333*b* based a logic input 331, a ground 225 (or negative supply voltage), and the second asynchronous electrical supply 112. As depicted herein, a logic input 331 may be any signal indicating the desired logical state of the logic output (e.g., logic output 333*a*). For example, the logic input 331 may indicate a logic 1 or logic 0 should be generated by the logic voltage circuitry 330 (e.g., logic output 333*a*) and the complementary logic output 333*b*. The second switching stage circuitry 222 may be enabled or disabled based on the logic output 333*a* and the complementary logic output 333*b*.

The complementary logic output (e.g., complementary logic output 333*b*) corresponds with the opposite of the logic output (e.g., logic output 333*a*). Thus, in an instance in which the logic output (e.g., logic output 333*a*) is a logic 0, the complementary logic output (e.g., complementary logic output 333*b*) is logic 1, and vice versa. As further described herein, a logic 1 corresponds to a particular voltage. Thus, the voltage level of the logic output and complementary logic output are dependent upon the supply voltage (e.g., second asynchronous electrical supply 112) and the supply ground (e.g., ground 225), respectively. As depicted in FIG. 2, a logic 1 output by the logic voltage circuitry 330 corresponds to the second asynchronous electrical supply 112, while a logic 0 output by the logic voltage circuitry 330 corresponds to the ground 225 (or negative supply voltage).

Figure 5:
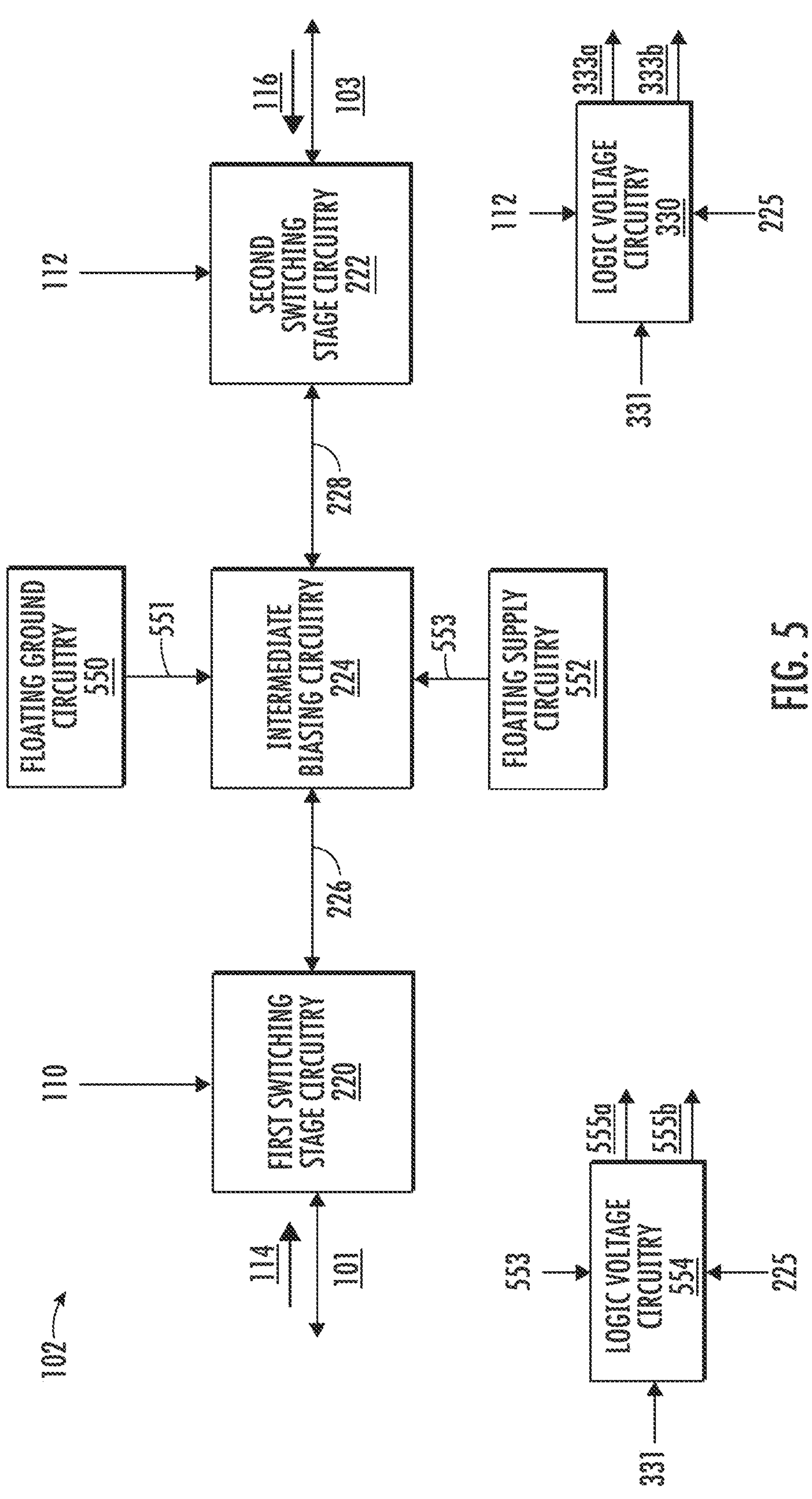
FIG. 5 depicts an example block diagram of example test control circuitry comprising protective circuitry including floating ground circuitry and floating supply circuitry in accordance with an example embodiment of the present disclosure.

However, additional logic voltage circuitry (e.g., logic voltage circuitry 554 as shown in FIG. 5) corresponds to the provided supply voltage and supply ground.

As further depicted in FIG. 3, the example first switching stage circuitry 220 is within the local domain of the IC 104, thus, the first asynchronous electrical supply 110 complies with the maximum voltage rating of the electrical components comprising the test control circuitry 102. The logic output 110*a* is based on the first asynchronous electrical supply 110 and is within the maximum voltage rating of the electrical components comprising the test control circuitry 102, for example, 1.8 volts for a logic 1 and 0 volts for a logic 0. The complementary logic output 110*b* represents the opposite logic value of the logic output 110*a*, thus, complementary logic output 110*b* is a logic 0 in an instance in which logic output 110*a* is a logic 1; and complementary logic output 110*b* is a logic 1 in an instance in which logic output 110*a* is a logic 0.

As depicted in FIG. 3, the first switching stage circuitry 220 includes a first transistor P2 configured to receive the logic output 110*a* and a complementary transistor N2 configured to receive the complementary logic output 110*b*. Thus, in an instance in which the first transistor P2 is a p-type transistor and the complementary transistor N2 is an n-type transistor, both transistors are enabled in an instance in which the logic output 110*a* is a logic 0.

As further depicted in FIG. 3, the example second switching stage circuitry 222 is defined by an external domain, for example, and external IO domain, thus, the second asynchronous electrical supply 112 may not be in compliance with the maximum voltage rating of the electrical components comprising the test control circuitry 102. The logic output 333*a* is based on the second asynchronous electrical supply 112 and may exceed the maximum voltage rating of one or more electrical components comprising the test control circuitry 102, for example, 3.6 volts for a logic 1 and 0 volts for a logic 0. The complementary logic output 333*b* represents the opposite logic value of the logic output 333*a*, thus, complementary logic output 333*b* is a logic 0 in an instance in which logic output 333*a* is a logic 1; and complementary logic output 333*b* is a logic 1 in an instance in which logic output 333*a* is a logic 0.

As depicted in FIG. 3, the second switching stage circuitry 222 includes a first transistor P1 configured to receive the logic output 333*a* and a complementary transistor N1 configured to receive the complementary logic output 333*b*. Thus, in an instance in which the first transistor P1 is a p-type transistor and the complementary transistor N1 is an n-type transistor, both transistors are enabled in an instance in which the logic output 333*a* is a logic 0.

As further depicted in FIG. 3, in an instance in which both the first switching stage circuitry 220 and the second switching stage circuitry 222 are enabled, electrical signals transmit through the test control circuitry 102. For example, the pad interface voltage 116 may be transmitted to the IC 104. Similarly, the electrical test signals 114 may be transmitted from the IC 104 to the pad interface 106.

As further depicted in FIG. 3, the intermediate biasing circuitry 224 is configured to define the intermediate voltage 334 between the first transistors P2, P1 of the first switching stage circuitry 220 and the second switching stage circuitry 222, respectively. The intermediate biasing circuitry 224 is further configured to define the intermediate voltage 336 between the complementary transistors N2, N1 of the first switching stage circuitry 220 and the second switching stage circuitry 222, respectively. As depicted in FIG. 3 the complementary biasing transistors P4, N4 and P3, N3, are enabled in an instance in which the both the logic output 110*a*/complementary logic output 110*b* and the logic output 330*a*/complementary logic output 330*b* are such that the test control circuitry 102 is disabled. Thus, the intermediate biasing circuitry 224 defines the intermediate voltages 334, 336 in an instance in which the intermediate voltages 334, 336 would otherwise be floating. The intermediate voltage 334 is defined based on the ground 225, while the intermediate voltage 336 is defined based on the second asynchronous electrical supply 112.

Referring now to FIG. 4A-FIG. 4B, two example cases in which stress 440 may be applied to the example transistors of the test control circuitry 102, are provided. FIG. 4A represents a case in which the test control circuitry 102 is turned off. Thus, both P1 and P2 are receiving a logic 1 at their respective gates, and N1 and N2 are receiving a logic 0 at their respective gates. In addition, the second asynchronous electrical supply 112 is a high voltage signal (e.g., maximum voltage of 3.6 volts), exceeding the voltage rating of the various components of the test control circuitry 102 (e.g., 1.8 volts). Thus, the logic output 333*a* is at 3.6 volts and the complementary logic output 333*b* is at 0 volts. Further, the logic output 110*a* is at 1.8 volts based on the first asynchronous electrical supply 110 and the complementary logic output 110*b* is at 0 volts. As further depicted in FIG. 4A, the pad interface voltage 116 is a high voltage signal (e.g., 3.6 volts).

A transistor experiences stress 440 in an instance in which any two terminals of the transistor (e.g., source terminal, gate terminal, drain terminal) experience a voltage drop greater than the maximum voltage rating of the transistor. In the depicted example of FIG. 4A, each transistor comprises a maximum voltage rating of 1.8 volts. Thus, any voltage difference across any two terminals greater than 1.8 volts will induce stress on the transistor. A transistor subjected to stress may fail and/or the expected life of the transistor may be reduced.

In the depicted case of FIG. 4A, a number of transistors comprising the test control circuitry 102 are experiencing stress 440. For example, the gate terminal of transistor N4 is at 3.6 volts while the drain terminal is at 0 volts. The gate terminal of transistor P1 is at 3.6 volts while the source terminal is at 0 volts. The drain terminal of transistor P1 is at 3.6 volts while the source terminal is at 0 volts. The gate terminal of transistor N1 is at 0 volts while the drain terminal is at 3.6 volts. The gate terminal of transistor P3 is at 0 volts while the source terminal is at 3.6 volts. The gate terminal of transistor N2 is at 0 volts while the drain terminal is at 3.6 volts. The source terminal of transistor N2 is at 0 volts while the drain terminal is at 3.6 volts.

In the depicted case of FIG. 4B, the test control circuitry 102 is once again turned off, thus, the logic output 333*a* is high voltage (e.g., 3.6 volts) and the complementary logic output 333*b* is at 0 volts. Further, the logic output 110*a* is a logic 1 (e.g., 1.8 volts) based on the first asynchronous electrical supply 110 and the complementary logic output 110*b* is at 0 volts. In addition, in the case of FIG. 4B, the pad interface voltage 116 is at 0 volts on conductor 103 and the conductor 101 is at 0 volts.

As such, a number of transistors comprising the test control circuitry 102 are experiencing stress 440. For example, the gate terminal of transistor N4 is at 3.6 volts while the drain terminal is at 0 volts. The gate terminal of transistor P1 is at 3.6 volts while the source terminal and the drain terminal are at 0 volts. The source terminal of transistor N1 is at 3.6 volts while the drain terminal and the gate terminal are at 0 volts. The gate terminal of transistor P3 is at 0 volts while the source terminal is at 3.6 volts. The drain terminal of transistor N2 is at 3.6 volts while the gate terminal and the source terminal are at 0 volts.

Although the depicted transistors have a maximum voltage rating of 1.8 volts and the high voltage signals exhibit a maximum voltage of 3.6 volts, the same principles may apply in any case in which one or more of the asynchronous control signals exceeds the maximum voltage rating of the electrical components comprising the test control circuitry 102.

The various example embodiments described herein utilize various techniques to protect the electrical components of the test control circuitry 102. For example, various protective circuitry components are utilized to protect the various transistors from high voltage inputs and fail-safe conditions. In some embodiments, floating ground circuitry and floating supply circuitry are utilized to generate a floating ground voltage and floating supply voltage based on the second asynchronous electrical supply. Such signals may be utilized to protect at least the transistors comprising the intermediate biasing circuitry.

In addition, level shifting circuitry based on the floating supply voltage may be utilized to protect one or more transistors of the first switching stage circuitry.

Further, stage protection circuitry leveraging the floating supply voltage and the floating ground voltage may be utilized to protect one or more transistors comprising the second switching stage circuitry.

In some embodiments, maximum selector circuitry based on a modified floating ground voltage and modified floating supply voltage generated by floating voltage modifier circuitry may be used to protect various components in fail safe conditions during which both the first asynchronous electrical supply and the second asynchronous electrical supply are turned off.

As a result of the herein described example embodiments and in some examples, the accuracy and durability of the test control circuitry may be greatly improved. In addition, such protections from high voltage may be accomplished without costly, bulky, and slow transistors comprising higher maximum voltage ratings.

Referring now to FIG. 5, an example block diagram depicting test control circuitry 102 is provided. The test control circuitry 102 includes protective circuitry configured to protect the biasing transistors of the intermediate biasing circuitry 224 in an instance in which high voltages exceeding the maximum voltage rating of the biasing transistors are experienced. The protective circuitry includes floating ground circuitry 550 and floating supply circuitry 552. As depicted in FIG. 5, the first switching stage circuitry 220 is configured to enable electrical flow through the first switching stage circuitry 220 based on the first asynchronous electrical supply 110. In addition, the second switching stage circuitry 222 is configured to enable electrical flow through the second switching stage circuitry 222 based on the second asynchronous electrical supply 112. The intermediate biasing circuitry 224 is electrically connected to the first switching stage circuitry 220 by conductor 226 and electrically connected to the second switching stage circuitry 222 by conductor 228. As described further herein, the conductors 226, 228 may comprise two wires, one connecting the PMOS transistors comprising the first switching stage circuitry 220 and the second switching stage circuitry 222, and one connecting the NMOS transistors comprising the first switching stage circuitry 220 and the second switching stage circuitry 222. As depicted in FIG. 5, the intermediate biasing circuitry 224 is configured to generate an intermediate voltage between the first switching stage circuitry 220 and the second switching stage circuitry 222 in an instance in which the test control circuitry 102 is off.

As depicted in FIG. 5, the example test control circuitry 102 includes floating supply circuitry 552. The floating supply circuitry 552 comprises any circuitry including hardware and/or software, configured to generate a floating supply voltage 553 configured as a reduced percentage of the second asynchronous electrical supply 112 at the intermediate biasing circuitry 224 in an instance in which the second asynchronous electrical supply 112 voltage exceeds a maximum voltage rating threshold of one or more biasing transistors comprising the intermediate biasing circuitry 224. A maximum voltage rating threshold is based at least in part on the maximum voltage rating of a transistor. A maximum voltage rating threshold represents a voltage difference across any two terminals of a transistor at which harmful stress may occur. In some embodiments, the maximum voltage rating threshold is the maximum voltage rating of a transistor. In some embodiments, the maximum voltage rating threshold may be a pre-determined percent within or in excess of the maximum voltage rating. In some examples, the maximum voltage rating threshold may be 10% greater than the maximum voltage rating of a transistor. For example, in an instance in which a transistor has a maximum voltage rating of 1.8 volts, the maximum voltage rating threshold may be $1.8+(1.8\times0.1)=1.98$ volts.

In one embodiment, the floating supply circuitry 552 is configured to reduce the second asynchronous electrical supply 112 by a percentage in an instance in which the second asynchronous electrical supply 112 exceeds the maximum voltage rating threshold for one or more transistors comprising the intermediate biasing circuitry 224. For example, the floating supply circuitry 552 may be configured to reduce the voltage of the second asynchronous electrical supply 112 approximately in half in an instance in which the second asynchronous electrical supply 112 exceeds the maximum voltage rating threshold. In some embodiments, the floating supply voltage 553 generated by the floating supply circuitry 552 may be between 51% and 55% of the second asynchronous electrical supply 112 in an instance in which the second asynchronous electrical supply 112 exceeds the maximum voltage rating threshold for one or more transistors comprising the intermediate biasing circuitry 224. More preferably, the floating supply voltage 553 generated by the floating supply circuitry 552 may be between 52% and 54% of the second asynchronous electrical supply 112 in an instance in which the second asynchronous electrical supply 112 exceeds the maximum voltage rating threshold for one or more transistors comprising the intermediate biasing circuitry 224. Most preferably, the floating supply voltage 553 generated by the floating supply circuitry 552 may be between 52.5% and 53.5% of the second asynchronous electrical supply 112 in an instance in which the second asynchronous electrical supply 112 exceeds the maximum voltage rating threshold for one or more transistors comprising the intermediate biasing circuitry 224. In an instance in which the second asynchronous electrical supply 112 does not exceed the maximum voltage rating threshold of one or more transistors comprising the intermediate biasing circuitry 224 the floating supply voltage 553 is equivalent to the voltage of the second asynchronous electrical supply 112. Thus, the floating supply voltage 553 represents a reduced voltage of the second asynchronous electrical supply 112 in an instance in which the second asynchronous electrical supply 112 exceeds the maximum voltage rating threshold for one or more transistors comprising the intermediate biasing circuitry 224. By reducing the floating supply voltage 553 compared to the second asynchronous electrical supply 112 as the second asynchronous electrical supply 112 exceeds the maximum voltage rating, transistors with a maximum voltage rating below the voltage of the second asynchronous electrical supply 112 may be protected from stress due to high voltage.

As further depicted in FIG. 5, the example test control circuitry 102 includes floating ground circuitry 550. The floating ground circuitry 550 comprises any circuitry including hardware and/or software, configured to generate a floating ground voltage 551 representing a voltage reduction of the second asynchronous electrical supply 112 lower than the floating supply voltage 553, in an instance in which the second asynchronous electrical supply 112 voltage exceeds a maximum voltage rating threshold of one or more biasing transistors comprising the intermediate biasing circuitry 224.

In one embodiment, the floating ground circuitry 550 is configured to reduce the second asynchronous electrical supply 112 by a percentage lower than the floating supply voltage 553 in an instance in which the second asynchronous electrical supply 112 exceeds the maximum voltage rating threshold for one or more transistors comprising the intermediate biasing circuitry 224. For example, the floating ground circuitry 550 may be configured to reduce the voltage of the second asynchronous electrical supply 112 to less than half in an instance in which the second asynchronous electrical supply 112 exceeds the maximum voltage rating threshold. In some embodiments, the floating ground voltage 551 generated by the floating ground circuitry 550 may be between 45% and 49% of the second asynchronous electrical supply 112 in an instance in which the second asynchronous electrical supply 112 exceeds the maximum voltage rating threshold for one or more transistors comprising the intermediate biasing circuitry 224. More preferably, the floating ground voltage 551 generated by the floating ground circuitry 550 may be between 46% and 48% of the second asynchronous electrical supply 112 in an instance in which the second asynchronous electrical supply 112 exceeds the maximum voltage rating threshold for one or more transistors comprising the intermediate biasing circuitry 224. Most preferably, the floating ground voltage 551 generated by the floating ground circuitry 550 may be between 46.5% and 47.5% of the second asynchronous electrical supply 112 in an instance in which the second asynchronous electrical supply 112 exceeds the maximum voltage rating threshold for one or more transistors comprising the intermediate biasing circuitry 224. In an instance in which the second asynchronous electrical supply 112 does not exceed the maximum voltage rating threshold of one or more transistors comprising the intermediate biasing circuitry 224 the floating ground voltage 551 is equivalent to the ground 225. Thus, the floating ground voltage 551 increases as the second asynchronous electrical supply 112 exceeds the maximum voltage rating threshold for one or more transistors comprising the intermediate biasing circuitry 224. By increasing the ground, transistors with a maximum voltage rating below the voltage of the second asynchronous electrical supply 112 may be protected from stress due to high voltage.

As further depicted in FIG. 5, the logic voltage circuitry 554 is configured to generate logic output 555*a* and complementary logic output 555*b* based on the floating supply voltage 553 dependent upon the logic input 331. Thus, the logical values provided by the logic voltage circuitry 554 coincide with the voltage of the floating supply voltage 553. As such, the logical values provided to the biasing transistors of the intermediate biasing circuitry 224 are reduced in accordance with the reduced voltage of the floating supply voltage 553.

As further depicted in FIG. 5, logic voltage circuitry 330 is configured to generate logic output 333*a* and complementary logic output 333*b* based on the second asynchronous electrical supply 112 dependent upon the logic input 331. Thus, the logical values provided by the logic voltage circuitry 330 coincide with the voltage of the second asynchronous electrical supply 112.

Figure 6:
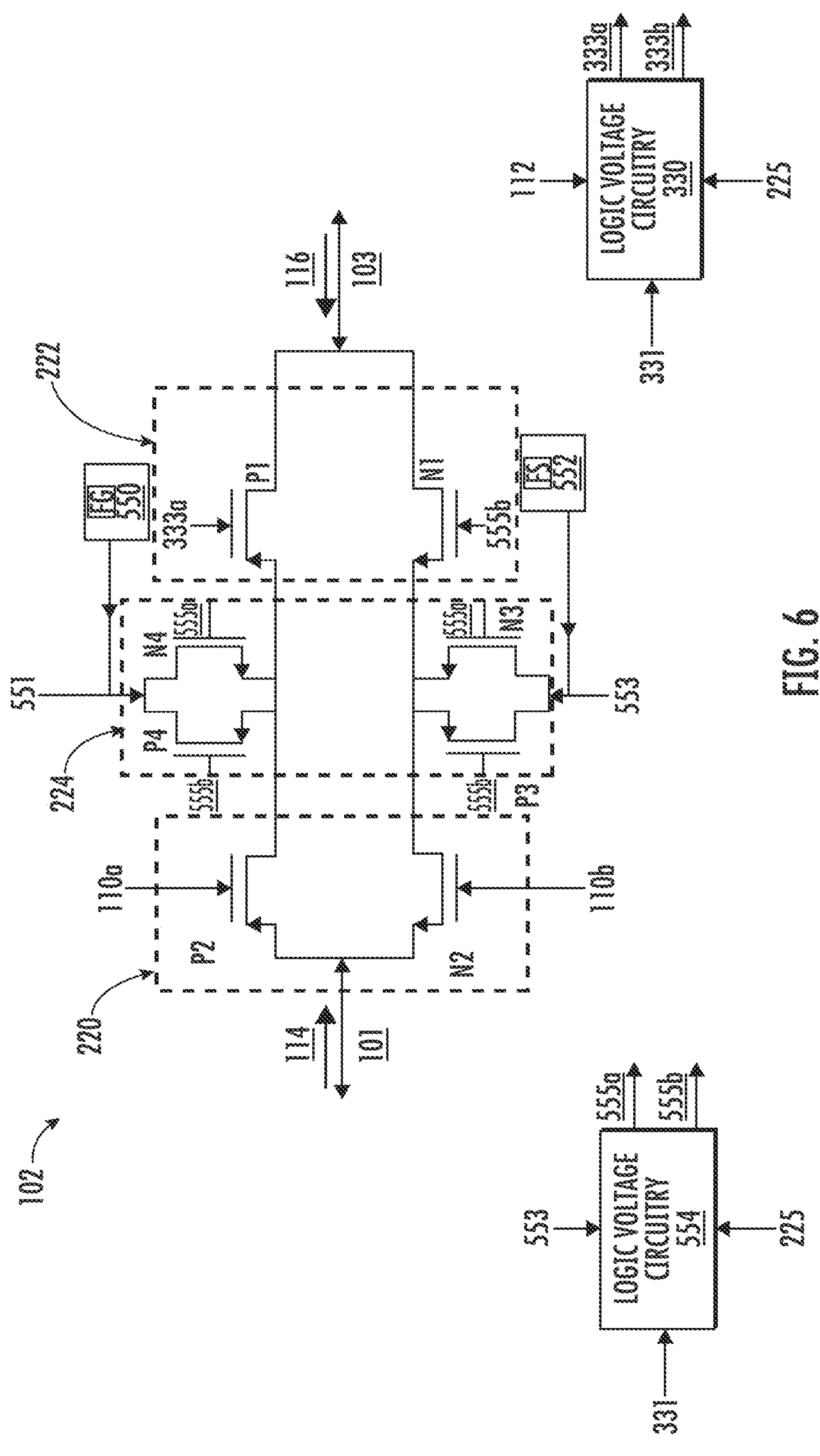
FIG. 6 depicts an example circuit diagram comprising test control circuitry including floating ground circuitry and floating supply circuitry in accordance with an example embodiment of the present disclosure.

Referring now to FIG. 6, an example embodiment of test control circuitry 102 comprising floating ground circuitry 550 and floating supply circuitry 552 configured to protect the biasing transistors P3, N3, P4, N4 of the intermediate biasing circuitry 224 is provided.

As depicted in FIG. 6, a source terminal of a first transistor P2 of the first switching stage circuitry 220 is electrically connected to a conductor 101 (which may be further electrically connected to the IC, e.g., IC 104). In addition, the source terminal of a first transistor P2 of the first switching stage circuitry 220 is electrically connected to a source terminal of a complement transistor N2 of the first switching stage circuitry 220. The gate of the first transistor P2 is electrically connected to logic output 110*a* while the gate of the complement transistor N2 is electrically connected to complementary logic output 110*b*. The drain terminal of the first transistor P2 of the first switching stage circuitry 220 is electrically connected to a source terminal of a first transistor P1 of second switching stage circuitry 222. The drain terminal of the complement transistor N2 of the first switching stage circuitry 220 is electrically connected to a source terminal of a complement transistor N1 of second switching stage circuitry 222. The drain terminal of the first transistor P1 is electrically connected to the drain terminal of the complement transistor N1 and electrically connected to the conductor 103 (which may be further electrically connected to the pad interface, e.g., pad interface 106).

As further depicted in FIG. 6, the source terminals of biasing transistors N4 and P4 of the intermediate biasing circuitry 224 are electrically connected, as well as electrically connected to the drain terminal of the first transistor P2 of the first switching stage circuitry 220 and the source terminal of the first transistor P1 of the second switching stage circuitry 222. In addition, the drain terminals of biasing transistors N4 and P4 of the intermediate biasing circuitry 224 are electrically connected. The floating ground voltage 551 is applied to the drain terminals of biasing transistors N4 and P4.

As further depicted in FIG. 6, the source terminals of biasing transistors N3 and P3 of the intermediate biasing circuitry 224 are electrically connected, as well as electrically connected to the drain terminal of the complement transistor N2 of the first switching stage circuitry 220 and the source terminal of the complement transistor N1 of the second switching stage circuitry 222. In addition, the drain terminals of biasing transistors N3 and P3 of the intermediate biasing circuitry 224 are electrically connected. The floating supply voltage 553 is applied to the drain terminals of biasing transistors N3 and P3.

As further depicted in FIG. 6, the gate terminals of biasing transistors P4, P3 of the intermediate biasing circuitry 224 and the gate terminal of complement transistor N1 of the second switching stage circuitry 222 are electrically connected to the complementary logic output 555*b* based on the floating supply voltage 553. The gate terminals of biasing transistors N4, N3 of the intermediate biasing circuitry 224 are electrically connected to the logic output 555_a_ based on the floating supply voltage 553. In addition, the gate terminal of the first transistor P1 of the second switching stage circuitry 222 is electrically connected to the logic output 333_a_ based on the second asynchronous electrical supply 112.

By applying the floating ground voltage 551 to the drain terminals of the biasing transistors N4, P4; the floating supply voltage 553 to the drain terminals of the biasing transistors N3, P3; and the gate terminals of the biasing transistors N3, N4, P3, P4 to logic outputs 555_a_, 555_b_ based on the floating supply voltage 553, the biasing transistors N3, N4, P3, P4 are protected from stress due to the high voltage second asynchronous electrical supply 112 signal.

Figure 7:
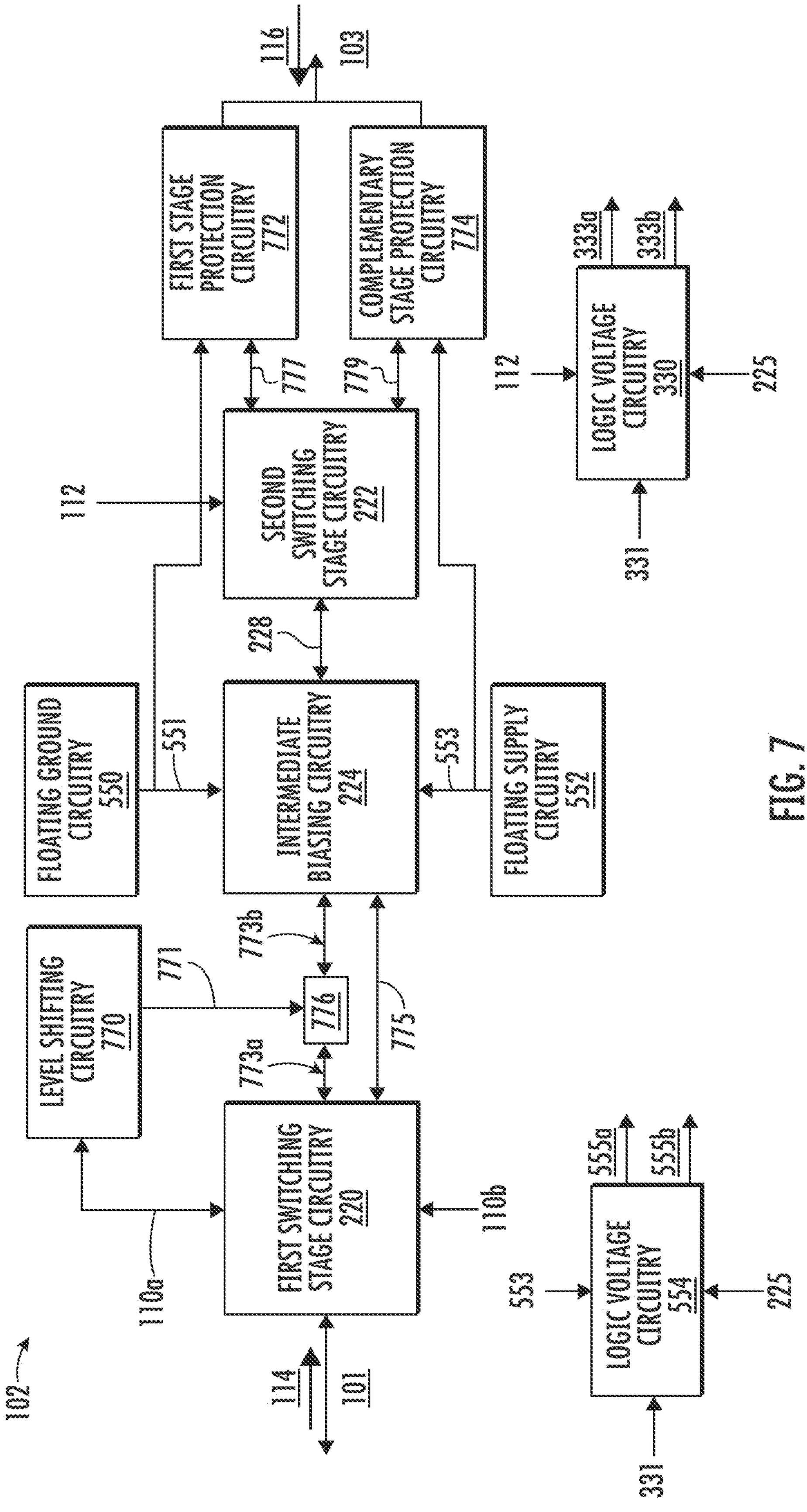
FIG. 7 depicts an example block diagram of example test control circuitry comprising protective circuitry including level shifting circuitry and stage protection circuitry in accordance with an example embodiment of the present disclosure.

Referring now to FIG. 7, an example block diagram of test control circuitry 102 comprising additional protective circuitry is provided. The example test control circuitry 102 includes additional protective circuitry including first stage protection circuitry 772 and complementary stage protection circuitry 774 configured to protect the transistor components of the second switching stage circuitry 222; and level shifting circuitry 770 configured to protect transistor components of the first switching stage circuitry 220.

As depicted in FIG. 7, the first switching stage circuitry 220 configured to receive electrical test signals 114 on the electrical conductor 101 and is further configured to enable electrical flow through the first switching stage circuitry 220 based on the first asynchronous electrical supply 110 logic output 110_a_. The first asynchronous electrical supply 110 logic output 110_a_ is further provided to the level shifting circuitry 770. As further depicted in FIG. 7, the example test control circuitry 102 includes a charge protection transistor 776 electrically connected to the first switching stage circuitry 220 through the conductor 773_a_ and to intermediate biasing circuitry 224 through a conductor 773_b_. The level shifting circuitry 770 is further electrically connected to the gate terminal of the charge protection transistor 776. As further depicted in FIG. 7, the intermediate biasing circuitry 224 is further electrically connected to the first switching stage circuitry 220 through the conductor 775.

As further depicted in FIG. 7, the intermediate biasing circuitry 224 is configured to receive a floating ground voltage 551 from floating ground circuitry 550 and floating supply voltage 553 from floating supply circuitry 552. The intermediate biasing circuitry 224 is further electrically connected to second switching stage circuitry 222 by one or more conductors 228.

As further depicted in FIG. 7, the second switching stage circuitry 222 is configured to enable electrical flow through the second switching stage circuitry 222 based on the second asynchronous electrical supply 112. In addition, the second switching stage circuitry 222 is electrically connected to the first stage protection circuitry 772 by conductor 777 and the complementary stage protection circuitry 774 by conductor 779. The first stage protection circuitry 772 is further configured to receive the floating ground voltage 551. The complementary stage protection circuitry 774 is further configured to receive the floating supply voltage 553. The first stage protection circuitry 772 and complementary stage protection circuitry 774 are both electrically connected to the conductor 103.

As depicted in FIG. 7, the test control circuitry 102 includes first stage protection circuitry 772 and complementary stage protection circuitry 774 as protective circuitry, configured to protect the transistor components of the second switching stage circuitry 222. The first stage protection circuitry 772 comprises any circuitry including hardware and/or software configured to eliminate stress on one or more first transistors comprising the second switching stage circuitry 222. For example, the first stage protection circuitry 772 may ensure the conductor 777 interfacing with the second switching stage circuitry 222 is associated with the floating ground voltage 551 in an instance in which the pad interface voltage 116 is at or near 0 and the second asynchronous electrical supply 112 is above the maximum voltage rating threshold for one or more transistor components of the second switching stage circuitry 222. Thus, the voltage on the conductor 777 may transition between the floating ground voltage 551 and the pad interface voltage 116. Example first stage protection circuitry 772 is depicted in relation to FIG. 8A.

As further depicted in FIG. 7, the test control circuitry 102 includes complementary stage protection circuitry 774 configured to protect the complementary transistor components of the second switching stage circuitry 222. The complementary stage protection circuitry 774 comprises any circuitry including hardware and/or software configured to eliminate stress on one or more complementary transistors comprising the second switching stage circuitry 222. For example, the complementary stage protection circuitry 774 may ensure the conductor 779 interfacing with the second switching stage circuitry 222 is associated with the floating supply voltage 553 in an instance in which the pad interface voltage 116 exceeds the maximum voltage rating threshold for one or more transistor components of the second switching stage circuitry 222 and the complement logic output is at or near 0 volts. Thus, the voltage on the conductor 779 may transition between 0 volts and the floating supply voltage 553. Example complementary stage protection circuitry 774 is depicted in relation to FIG. 8A.

As further depicted in FIG. 7, the test control circuitry 102 includes additional protective circuitry including level shifting circuitry 770 electrically connected to a charge protection transistor 776. Level shifting circuitry 770 comprises any circuitry including hardware and/or software configured to ensure there is no path for charging/discharging on the conductor 101 through the first switching stage circuitry 220 due to the presence of the second asynchronous electrical supply 112 in an instance in which the first asynchronous electrical supply 110 voltage is 0. The level shifting circuitry 770 is configured to provide the gate voltage to the charge protection transistor 776 positioned between the first switching stage circuitry 220 and the intermediate biasing circuitry 224 to eliminate undesired charging of the conductor 101 due to the presence of the floating ground voltage 551 in an instance in which the first switching stage circuitry 220 is disabled. The level shifting circuitry 770 may additionally include a voltage level shifter configured to convert the first asynchronous electrical supply voltage as logic output 110_a_ to a voltage within the domain of the floating supply voltage 553. Example level shifting circuitry 770 and corresponding charge protection transistor 776 is depicted in relation to FIG. 8A.

Figure 8A:
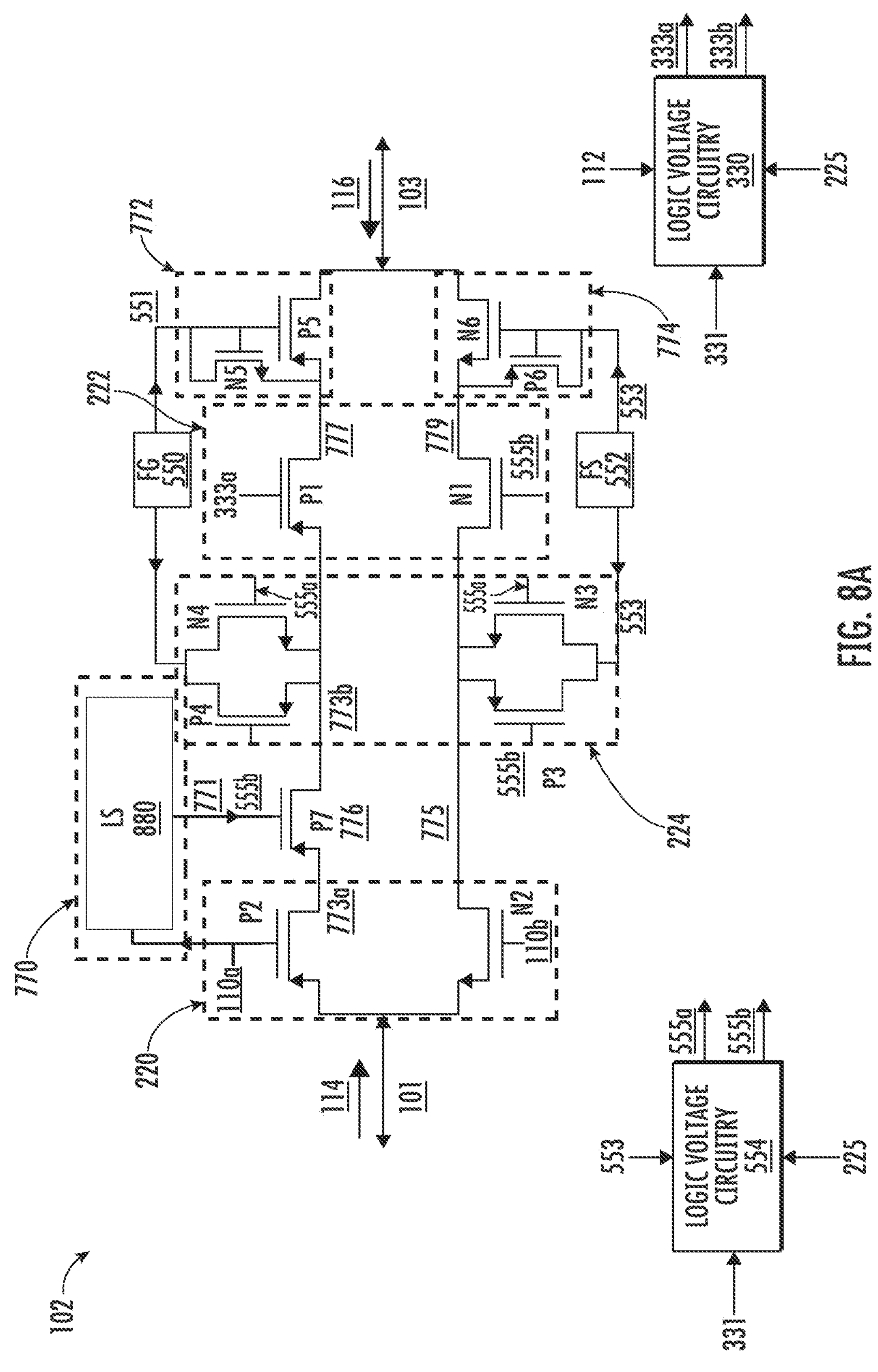
FIG. 8A depicts an example circuit diagram comprising test control circuitry including first stage protection circuitry and complementary stage protection circuitry in accordance with an example embodiment of the present disclosure.

Referring now to FIG. 8A, an example embodiment of test control circuitry 102 including level shifting circuitry 770, first stage protection circuitry 772, and complementary stage protection circuitry 774 is provided. The first stage protection circuitry 772 is configured to protect first transistor P1 of the second switching stage circuitry 222 from stress due to voltages exceeding the maximum voltage rating of the first transistor P1. The complementary stage protection circuitry 774 is configured to protect complementary transistor N1 of the second switching stage circuitry 222 from stress due to voltages exceeding the maximum voltage rating of the complementary transistor N1. The level shifting circuitry 770 is configured to prevent undesired charging of the conductor 101 through the first switching stage circuitry 220 due to the presence of the floating ground voltage 551 on the conductor between the first switching stage circuitry 220 and the second switching stage circuitry 222.

As depicted in FIG. 8A, a source terminal of a first transistor P2 of the first switching stage circuitry 220 is electrically connected to a conductor 101 (which may be further electrically connected to the IC, e.g., IC 104). In addition, the source terminal of a first transistor P2 of the first switching stage circuitry 220 is electrically connected to a source terminal of a complement transistor N2 of the first switching stage circuitry 220. The gate of the first transistor P2 is electrically connected to logic output 110*a* while the gate of the complement transistor N2 is electrically connected to complementary logic output 110*b*. In addition, the gate of the first transistor P2 is electrically connected to the level shifter 880 of the level shifting circuitry 770. The drain terminal of the first transistor P2 of the first switching stage circuitry 220 is electrically connected to a source terminal of a charge protection transistor 776 (P7). The charge protection transistor 776 (P7) is further configured to receive a level shifted output voltage 771 at a gate terminal from the electrically connected level shifter 880, wherein the level shifted output voltage 771 is based on the logic output 110*a* and the floating supply voltage 553. The level shifted output voltage 771 is further safe-stated to the floating supply voltage 553. Safe-stated means when the logic output 110*a* is equal to 0, for example, due to a first asynchronous electrical supply 110 of zero and the second asynchronous electrical supply 112 present due to the asynchronous arrival of the two signals, the level shifted output voltage 771 will be equal to the floating supply voltage 553. Safe-stating the gate voltage of the charge protection transistor 776 (P7) to the floating supply voltage 553 is a principal purpose of the charge protection transistor 776. The drain terminal of the charge protection transistor P7 of the level shifting circuitry 770 is electrically connected to a source terminal of a first transistor P1 of second switching stage circuitry 222. The drain terminal of the complement transistor N2 of the first switching stage circuitry 220 is electrically connected to a source terminal of a complement transistor N1 of second switching stage circuitry 222.

As further depicted in FIG. 8A, the drain terminal of the first transistor P1 is electrically connected to a source terminal of a first transistor P5 of the first stage protection circuitry 772 by conductor 777. In addition, the drain terminal of the first transistor P1 is electrically connected to a source terminal of a second transistor N5 of the first stage protection circuitry 772 by conductor 777. The gate terminals of the first transistor P5 and the second transistor N5 of the first stage protection circuitry 772 are electrically connected, as well as electrically connected to the drain terminal of the second transistor N5 and the floating ground voltage 551. The drain terminal of the first transistor P5 of the first stage protection circuitry 772 is further electrically connected to the conductor 103 (which may be further electrically connected to the pad interface, e.g., pad interface 106).

As further depicted in FIG. 8A, the drain terminal of the complement transistor N1 is electrically connected to a source terminal of a first transistor N6 of the complementary stage protection circuitry 774 by conductor 779. In addition, the drain terminal of the complement transistor N1 is electrically connected to a source terminal of a second transistor P6 of the complementary stage protection circuitry 774 by conductor 779. The gate terminals of the first transistor N6 and the second transistor P6 of the complementary stage protection circuitry 774 are electrically connected, as well as electrically connected to the drain terminal of the second transistor P6 and the floating supply voltage 553. The drain terminal of the first transistor N6 of the complementary stage protection circuitry 774 is further electrically connected to the conductor 103 (which may be further electrically connected to the pad interface, e.g., pad interface 106) and the drain terminal of the first transistor P5 of the first stage protection circuitry 772.

As further depicted in FIG. 8A, the source terminals of biasing transistors N4 and P4 of the intermediate biasing circuitry 224 are electrically connected, as well as electrically connected to the drain terminal of the charge protection transistor P7 of the level shifting circuitry 770 and the source terminal of the first transistor P1 of the second switching stage circuitry 222. In addition, the drain terminals of biasing transistors N4 and P4 of the intermediate biasing circuitry 224 are electrically connected. The floating ground voltage 551 is applied to the drain terminals of biasing transistors N4 and P4.

As further depicted in FIG. 8A, the source terminals of biasing transistors N3 and P3 of the intermediate biasing circuitry 224 are electrically connected, as well as electrically connected to the drain terminal of the complement transistor N2 of the first switching stage circuitry 220 and the source terminal of the complement transistor N1 of the second switching stage circuitry 222. In addition, the drain terminals of biasing transistors N3 and P3 of the intermediate biasing circuitry 224 are electrically connected. The floating supply voltage 553 is applied to the drain terminals of biasing transistors N3 and P3.

As further depicted in FIG. 8A, the gate terminals of biasing transistors P4, P3 of the intermediate biasing circuitry 224 and the gate terminal of complement transistor N1 of the second switching stage circuitry 222 are electrically connected to the complementary logic output 555*b* based on the floating supply voltage 553. The gate terminals of biasing transistors N4, N3 of the intermediate biasing circuitry 224 are electrically connected to the logic output 555*a* based on the floating supply voltage 553. In addition, the gate terminal of the first transistor P1 of the second switching stage circuitry 222 is electrically connected to the logic output 333*a* based on the second asynchronous electrical supply 112.

With additions of the protective circuitry components: level shifting circuitry 770, first stage protection circuitry 772, complementary stage protection circuitry 774, floating ground circuitry 550, and floating supply circuitry 552; the test control circuitry 102 is resilient to high voltages on the second asynchronous electrical supply 112 and the pad interface voltage 116 during normal operation. However, additional protections may be implemented to protect against stress on various electrical components of the test control circuitry 102 during a fail-safe mode.

Figure 8B:
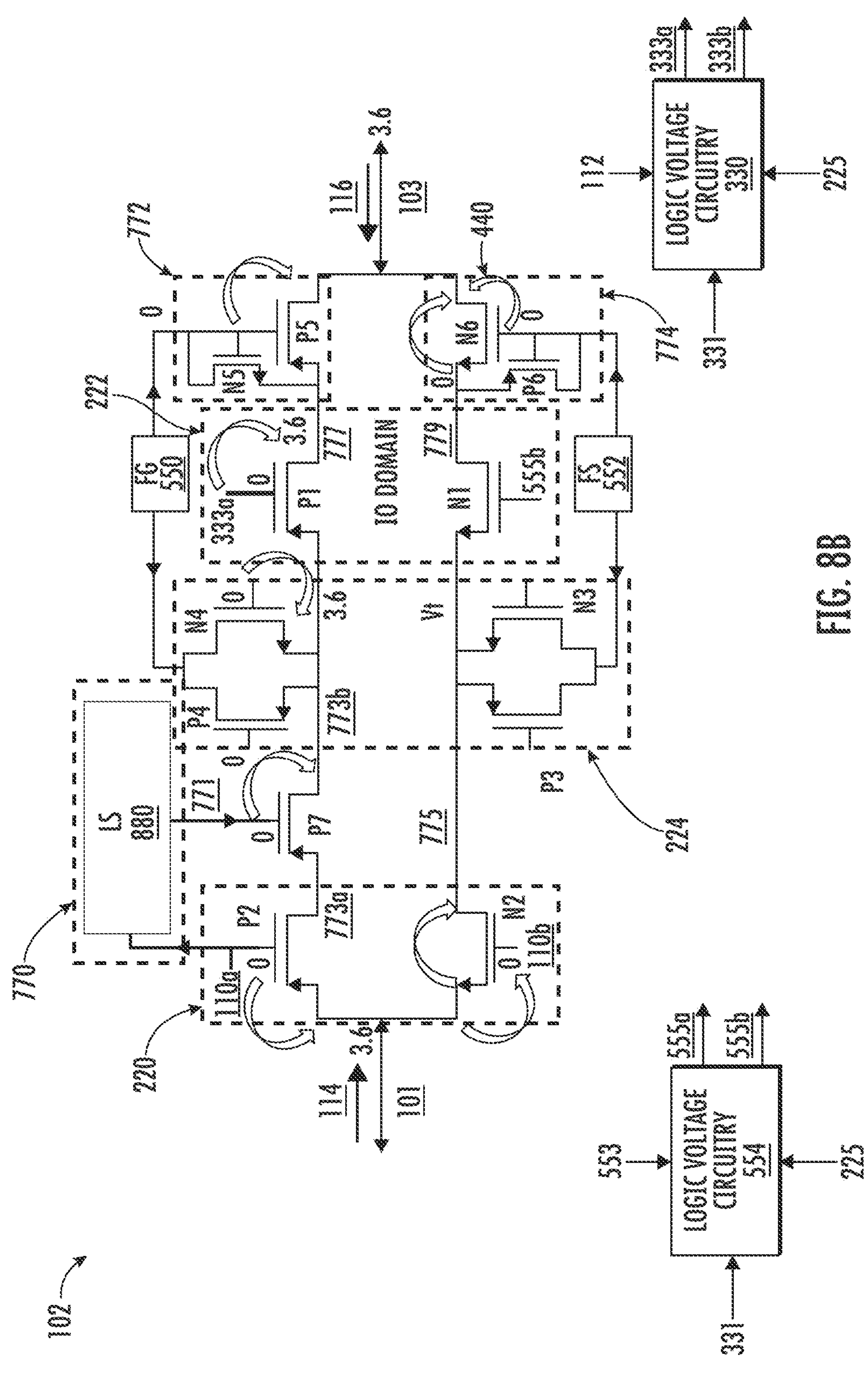
FIG. 8B depicts stresses on an example circuit diagram comprising test control circuitry including first stage protection circuitry and complementary stage protection circuitry in accordance with an example embodiment of the present disclosure.

Referring now to FIG. 8B, various stresses 440 on the test control circuitry 102 configured with various protective circuitry during a fail-safe mode, are shown. A fail-safe mode may occur in an instance in which both the first asynchronous electrical supply 110 and the second asynchronous electrical supply 112 are brought to 0 volts and the pad interface voltage 116 is at a high voltage, exceeding the maximum voltage rating of one or more electrical components of the test control circuitry 102. As shown in FIG. 8B, in such a state, the first transistor P1 of the second switching stage circuitry 222 and the first transistor P5 of the first stage protection circuitry 772 may enable electrical flow, allowing the internal conductors, for example conductor 777 and conductor 773*b* to charge to a high voltage. Such a high voltage may cause stress on transistors P5, N5, N4, and P7. In addition, the gate voltage on transistors P7 and P2 are also at 0 volts, allowing the high voltage pad interface voltage 116 to pass all the way to conductor 101 and the IC, which is undesirable. Such a result causes further stress 440 at the first transistor P2 and complement transistor N2 of the first switching stage circuitry 220. In addition, stress 440 may be experienced by the first transistor N6 of the complementary stage protection circuitry 774 based on a high voltage pad interface voltage 116 at conductor 103.

Figure 9:
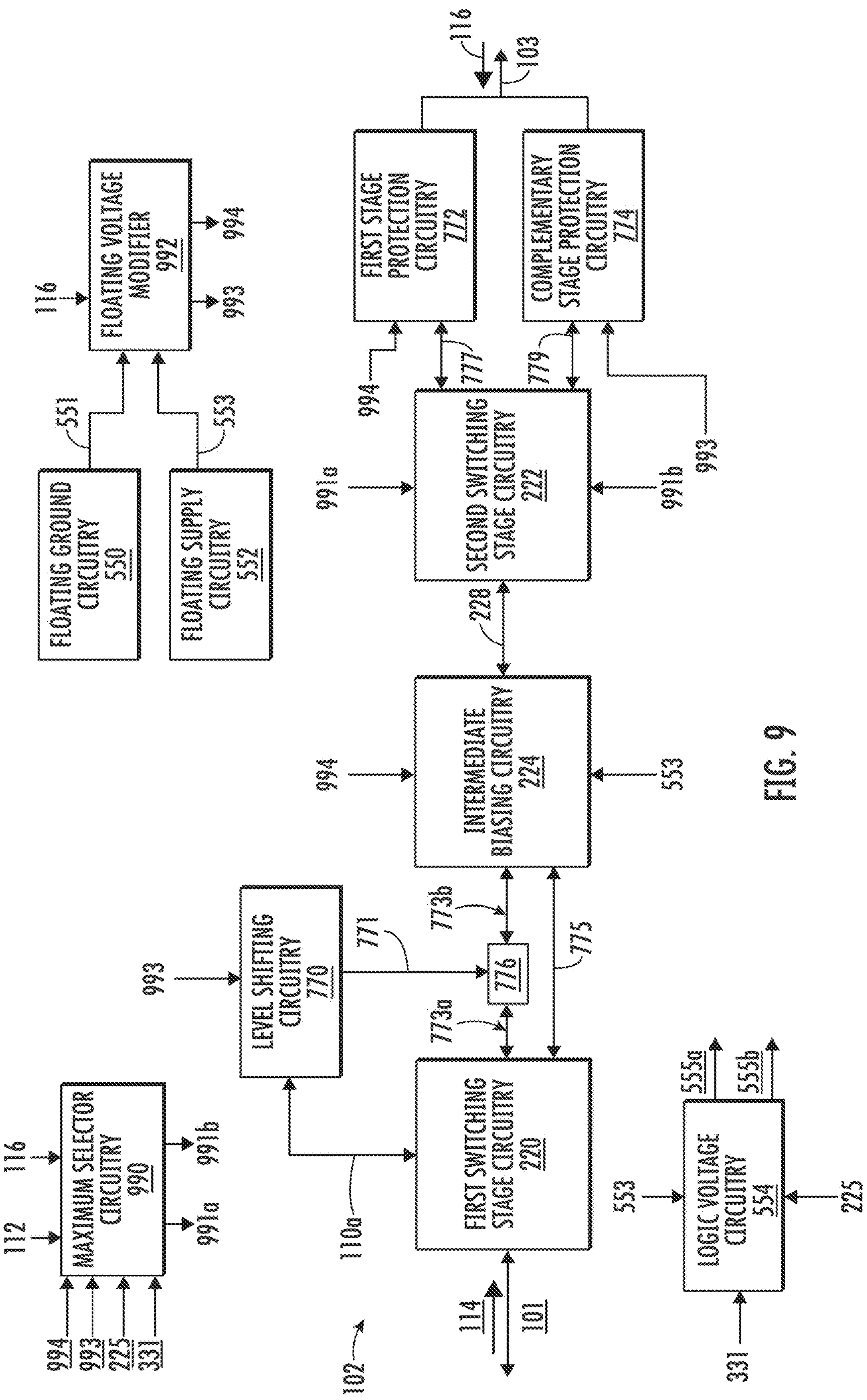
FIG. 9 depicts an example block diagram of example test control circuitry comprising a floating voltage modifier and maximum selector circuitry in accordance with an example embodiment of the present disclosure.

Referring now to FIG. 9, example test control circuitry 102 comprising various protective circuitry components is provided. As depicted in FIG. 9, the first switching stage circuitry 220 is configured to receive electrical test signals 114 on the electrical conductor 101 and is further configured to enable electrical flow through the first switching stage circuitry 220 based on the first asynchronous electrical supply 110 logic output 110*a*. The first asynchronous electrical supply 110 logic output 110*a* is further provided to the level shifting circuitry 770. In addition, a charge protection transistor 776 is electrically connected to the first switching stage circuitry 220 through the conductor 773*a* and to intermediate biasing circuitry 224 through a conductor 773*b*. The level shifting circuitry 770 is further electrically connected to the gate terminal of the charge protection transistor 776. As further depicted in FIG. 9, the intermediate biasing circuitry 224 is further electrically connected to the first switching stage circuitry 220 through the conductor 775.

As further depicted in FIG. 9, the intermediate biasing circuitry 224 is configured to receive a modified floating ground voltage 994 from floating voltage modifier 992 and floating supply voltage 553 from floating supply circuitry 552. The intermediate biasing circuitry 224 is further electrically connected to second switching stage circuitry 222 by one or more conductors 228.

As further depicted in FIG. 9, the second switching stage circuitry 222 is configured to enable electrical flow through the second switching stage circuitry 222 based on a modified logic output 991*a* and a modified complementary logic output 991*b* generated by maximum selector circuitry 990. In addition, the second switching stage circuitry 222 is electrically connected to the first stage protection circuitry 772 by conductor 777 and the complementary stage protection circuitry 774 by conductor 779. The first stage protection circuitry 772 is further configured to receive the modified floating ground voltage 994. The complementary stage protection circuitry 774 is further configured to receive a modified floating supply voltage 993. The first stage protection circuitry 772 and complementary stage protection circuitry 774 are both electrically connected to the conductor 103.

As depicted in FIG. 9, the test control circuitry 102 includes a floating voltage modifier 992. The floating voltage modifier 992 comprises any circuitry including hardware and/or software configured to generate a modified floating supply voltage 993 and a modified floating ground voltage 994 based on the floating supply voltage 553 generated by the floating supply circuitry 552, the floating ground voltage 551 generated by the floating ground circuitry 550, and the pad interface voltage 116.

The modified floating ground voltage 994 is substantially equivalent to the floating ground voltage 551, except in an instance in which the second asynchronous electrical supply 112 is less than the maximum voltage rating of one or more of the electrical components comprising the second switching stage circuitry 222; or in an instance in which both the first asynchronous electrical supply 110 and the second asynchronous electrical supply 112 are at 0 volts. In an instance in which the first asynchronous electrical supply 110 and the second asynchronous electrical supply 112 are at 0 volts, the modified floating ground voltage 994 is updated based on the pad interface voltage 116. For example, in some embodiments, the floating voltage modifier 992 is configured to generate the modified floating ground voltage 994 as a percentage of the pad interface voltage 116 in an instance in which the first asynchronous electrical supply 110 is 0 volts; the second asynchronous electrical supply 112 is 0 volts; and the pad interface voltage 116 is any valid voltage apart from 0 volts.

In one embodiment, the floating voltage modifier 992 may reduce the pad interface voltage 116 by a percentage in an instance in which the first asynchronous electrical supply 110 and the second asynchronous electrical supply 112 are at 0 volts. For example, the floating voltage modifier 992 may be configured to reduce the voltage of the modified floating ground voltage 994 at approximately half of the pad interface voltage 116 in an instance in which the first asynchronous electrical supply 110 and the second asynchronous electrical supply 112 are at 0 volts. In some embodiments, the modified floating ground voltage 994 generated by the floating voltage modifier 992 may be between 51% and 55% of the pad interface voltage 116 in an instance in which the first asynchronous electrical supply 110 and the second asynchronous electrical supply 112 are at 0 volts. More preferably, the modified floating ground voltage 994 generated by the floating voltage modifier 992 may be between 52% and 54% of the pad interface voltage 116 in an instance in which the first asynchronous electrical supply 110 and the second asynchronous electrical supply 112 are at 0 volts. Most preferably, the modified floating ground voltage 994 generated by the floating voltage modifier 992 may be between 52.5% and 53.5% of the pad interface voltage 116 in an instance in which the first asynchronous electrical supply 110 and the second asynchronous electrical supply 112 are at 0 volts. Thus, the modified floating ground voltage 994 applied at the complementary stage protection circuitry 774 may prevent current from flowing through the various electrical components in an instance in which the first asynchronous electrical supply 110 and the second asynchronous electrical supply 112 are at 0 volts.

The modified floating supply voltage 993 is substantially equivalent to the floating supply voltage 553. However, similar to the modified floating ground voltage 994, in an instance in which both the first asynchronous electrical supply 110 and the second asynchronous electrical supply 112 are at 0 volts, the modified floating supply voltage 993 is generated at a reduced percentage of the pad interface voltage 116 equivalent to the modified floating ground voltage 994. For example, in an instance in which the modified floating ground voltage 994 is generated at 53% of the pad interface voltage 116, the modified floating supply voltage 993 is also generated at 53% of the pad interface voltage 116.

As further depicted in FIG. 9, the test control circuitry 102 includes maximum selector circuitry 990. Maximum selector circuitry 990 comprises any circuitry including hardware and/or software configured to generate a modified logic output 991*a* and a modified complementary logic output 991*b* based on the modified floating supply voltage 993, the modified floating ground voltage 994, the second asynchronous electrical supply 112, the pad interface voltage 116, and the ground 225. The modified logic output 991*a* and the modified complementary logic output 991*b* may be used to control one or more transistors comprising the second switching stage circuitry 222. To prevent electrical flow through the test control circuitry 102 during a fail-safe mode, the voltage applied to the gate of the first transistor P1 of the second switching stage circuitry 222 and the complement transistor N1 of the second switching stage circuitry 222 may be a function of the second asynchronous electrical supply 112 and the pad interface voltage 116.

In some embodiments, the modified logic output 991*a* provided to the second switching stage circuitry 222 and the modified complementary logic output 991*b* provided to the second switching stage circuitry 222 may be based on different supply and ground voltages. For example, the logic 1 of the modified logic output 991*a* may be a function of the pad interface voltage 116 and the second asynchronous electrical supply 112, while the logic 0 of the modified logic output 991*a* may be based on the modified floating ground voltage 994. The modified logic output 991*a* may be used to determine the logic value of the modified complementary logic output 991*b*, however, the modified complementary logic output 991*b* may be based on separate supply and ground voltages. For example, the logic 1 of the modified complementary logic output 991*b* may be based on the modified floating supply voltage 993, while the logic 0 of the modified complementary logic output 991*b* may be based on the ground 225. An example embodiment of the maximum selector circuitry 990 is further described in relation to FIG. 10.

Figure 10:
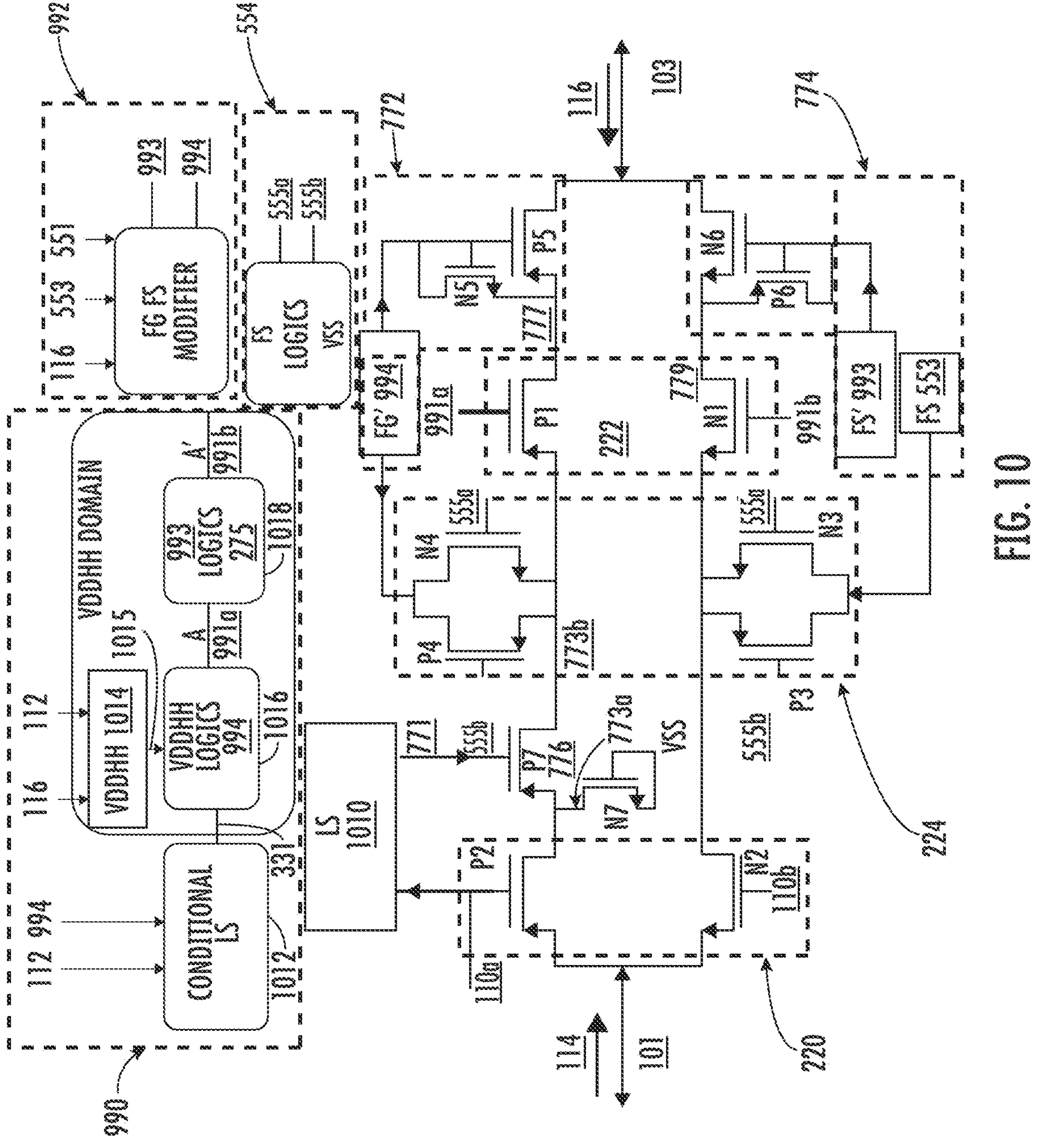
FIG. 10 depicts an example circuit diagram comprising example test control circuitry comprising a floating voltage modifier and maximum selector circuitry in accordance with an example embodiment of the present disclosure.

Referring now to FIG. 10, an example embodiment of test control circuitry 102, including maximum selector circuitry 990 and a floating voltage modifier 992 are provided.

As depicted in FIG. 10, a source terminal of a first transistor P2 of the first switching stage circuitry 220 is electrically connected to a conductor 101 (which may be further electrically connected to the IC, e.g., IC 104). In addition, the source terminal of a first transistor P2 of the first switching stage circuitry 220 is electrically connected to a source terminal of a complement transistor N2 of the first switching stage circuitry 220. The gate of the first transistor P2 is electrically connected to logic output 110*a* while the gate of the complement transistor N2 is electrically connected to complementary logic output 110*b*. In addition, the gate of the first transistor P2 is electrically connected to the level shifter 1010. The drain terminal of the first transistor P2 of the first switching stage circuitry 220 is electrically connected to a source terminal of a charge protection transistor 776 (P7) and a drain terminal of a gate-source shorted off net protection transistor N7. The charge protection transistor 776 (P7) is further configured to receive a level shifted output voltage 771 at a gate terminal from the electrically connected level shifter 1010, wherein the level shifted output voltage 771 is based on the logic output 110*a* and the modified floating supply voltage 993. The drain terminal of the charge protection transistor 776 (P7) is electrically connected to a source terminal of a first transistor P1 of second switching stage circuitry 222. The drain terminal of the complement transistor N2 of the first switching stage circuitry 220 is electrically connected to a source terminal of a complement transistor N1 of second switching stage circuitry 222.

As further depicted in FIG. 10, the drain terminal of the first transistor P1 is electrically connected to a source terminal of a first transistor P5 of the first stage protection circuitry 772 by conductor 777. In addition, the drain terminal of the first transistor P1 is electrically connected to a source terminal of a second transistor N5 of the first stage protection circuitry 772 by conductor 777. The gate terminals of the first transistor P5 and the second transistor N5 of the first stage protection circuitry 772 are electrically connected, as well as electrically connected to the drain terminal of the second transistor N5 and the modified floating ground voltage 994. The drain terminal of the first transistor P5 of the first stage protection circuitry 772 is further electrically connected to the conductor 103 (which may be further electrically connected to the pad interface, e.g., pad interface voltage 116).

As further depicted in FIG. 10, the drain terminal of the complement transistor N1 is electrically connected to a source terminal of a first transistor N6 of the complementary stage protection circuitry 774 by conductor 779. In addition, the drain terminal of the complement transistor N1 is electrically connected to a source terminal of a second transistor P6 of the complementary stage protection circuitry 774 by conductor 779. The gate terminals of the first transistor N6 and the second transistor P6 of the complementary stage protection circuitry 774 are electrically connected, as well as electrically connected to the drain terminal of the second transistor P6 and the modified floating supply voltage 993. The drain terminal of the first transistor N6 of the complementary stage protection circuitry 774 is further electrically connected to the conductor 103 (which may be further electrically connected to the pad interface, e.g., pad interface 106) and the drain terminal of the first transistor P5 of the first stage protection circuitry 772.

As further depicted in FIG. 10, the source terminals of biasing transistors N4 and P4 of the intermediate biasing circuitry 224 are electrically connected, as well as electrically connected to the drain terminal of the charge protection transistor 776 (P7) and the source terminal of the first transistor P1 of the second switching stage circuitry 222. In addition, the drain terminals of biasing transistors N4 and P4 of the intermediate biasing circuitry 224 are electrically connected. The modified floating ground voltage 994 is applied to the drain terminals of biasing transistors N4 and P4.

As further depicted in FIG. 10, the source terminals of biasing transistors N3 and P3 of the intermediate biasing circuitry 224 are electrically connected, as well as electrically connected to the drain terminal of the complement transistor N2 of the first switching stage circuitry 220 and the source terminal of the complement transistor N1 of the second switching stage circuitry 222. In addition, the drain terminals of biasing transistors N3 and P3 of the intermediate biasing circuitry 224 are electrically connected. The floating supply voltage 553 is applied to the drain terminals of biasing transistors N3 and P3.

As further depicted in FIG. 10, the gate terminals of biasing transistors P4, P3 of the intermediate biasing circuitry 224 are electrically connected to the complementary logic output 555*b* based on the floating supply voltage 553. The gate terminals of biasing transistors N4, N3 of the intermediate biasing circuitry 224 are electrically connected to the logic output 555*a* based on the floating supply voltage 553. In addition, the gate terminal of the first transistor P1 of the second switching stage circuitry 222 is electrically connected to the modified logic output 991*a* generated by the maximum selector circuitry 990. Further, the gate terminal of complement transistor N1 of the second switching stage circuitry 222 is electrically connected to the modified complementary logic output 991*b* generated by the maximum selector circuitry 990.

As depicted in FIG. 10, the net protection transistor N7 has been added. The net protection transistor N7 ensures the conductor 773*a* between the first transistor P2 of the first switching stage circuitry 220 and the charge protection transistor 776 (P7) is not at a negative voltage.

As further depicted in FIG. 10, the level shifter 1010 is configured to output a level shifted output voltage 771 based on the logic output 110*a* and the modified floating supply voltage 993. Thus, the gate voltage received at the gate of the charge protection transistor P7 is shifted to the modified floating supply voltage 993 domain.

As further depicted in FIG. 10, the test control circuitry 102 includes maximum selector circuitry 990. The maximum selector circuitry 990 is configured to generate a modified logic output 991*a* and a modified complementary logic output 991*b* based on the modified floating supply voltage 993, the modified floating ground voltage 994, the second asynchronous electrical supply 112, the pad interface voltage 116, the ground 225, and the logic input 331.

As described herein, a logic input 331 may be any signal indicating the desired logical state of a logic output (e.g., modified logic output 991*a*). For example, the logic input 331, may indicate that a logic 1 or logic 0 should be generated as the modified logic output 991*a* of the maximum selector circuitry 990 and the opposite logic output as the modified complementary logic output 991*b*. Thus, in an instance in which the logic output (e.g., modified logic output 991*a*) is a logic 0, the complementary logic output (e.g., modified complementary logic output 991*b*) is logic 1, and vice versa. As further described herein, a logic 1 corresponds to a particular voltage. Thus, the voltage level of the modified logic output 991*a* and modified complementary logic output 991*b* are dependent upon the supply voltage provided to the logic block circuitry and the supply ground, respectively.

The maximum selector circuitry 990 depicted in FIG. 10 includes a first logic block 1016 for determining the modified logic output 991*a* and a second logic block 1018 for determining the modified complementary logic output 991*b*. The supply voltage of the first logic block 1016 is defined by the supply voltage output 1015 generated by the supply voltage generator 1014. Thus, a logic 1 generated by the first logic block 1016 is equivalent to the supply voltage output 1015. The ground voltage of the first logic block 1016 is defined by the modified floating ground voltage 994. Thus, a logic 0 generated by the first logic block 1016 is equivalent to the modified floating ground voltage 994.

The modified complementary logic output 991*b* is generated by a second logic block 1018. Thus, although the modified logic output 991*a* is used to determine the logic output of the second logic block 1018 (e.g., logic 0 in an instance in which modified logic output 991*a* is a logic 1 and logic 1 in an instance in which modified logic output 991*a* is a logic 0), the output voltages may be different. For example, as depicted in FIG. 10, the supply voltage of the second logic block 1018 is defined by the modified floating supply voltage 993. Thus, a logic 1 generated by the second logic block 1018 is equivalent to the modified floating supply voltage 993. The ground voltage of the second logic block 1018 is defined by the ground 225. Thus, a logic 0 generated by the first logic block 1016 is equivalent to the ground 225.

As further depicted in FIG. 10, the maximum selector circuitry 990 includes a supply voltage generator 1014 configured to generate a supply voltage output 1015. The supply voltage generator 1014 generates a supply voltage output 1015 based on the state of the pad interface voltage 116 and the second asynchronous electrical supply 112. For example, in an instance in which the second asynchronous electrical supply 112 is present, the supply voltage output 1015 is equal to the second asynchronous electrical supply 112. In an instance in which the second asynchronous electrical supply 112 is not present, but the pad interface voltage 116 is present, the supply voltage output 1015 is equal to the pad interface voltage 116.

As further depicted in FIG. 10, the maximum selector circuitry 990 includes a conditional level shifting block 1012. The conditional level shifting block 1012 comprises any circuitry including hardware and/or software configured to alter the voltage of the logic input 331 based on the voltage of the second asynchronous electrical supply 112 and the modified floating ground voltage 994 to prevent stress on the transistor components of the first logic block 1016. As depicted in FIG. 10, the conditional level shifting block 1012 is configured to output the logic input 331 based on the second asynchronous electrical supply 112 in an instance in which the second asynchronous electrical supply 112 is present. However, in an instance in which the second asynchronous electrical supply 112 is not present and the pad interface voltage is within a finite range, the logic input 331 is based on the modified floating ground voltage 994.

With the additional protective circuitry (e.g., maximum selector circuitry 990, floating voltage modifier 992, level shifter 1010, net protection transistor N7) shown in FIG. 10; the depicted test control circuitry 102 is configured to fully operate during a fail-safe mode. In addition, the depicted test control circuitry 102 of FIG. 10 is configured to operate in high voltage conditions without damaging the internal electrical components of the test control circuitry 102.

While this detailed description has set forth some embodiments of the present invention, the appended claims cover other embodiments of the present invention which differ from the described embodiments according to various modifications and improvements. For example, one skilled in the art may recognize that such principles may be applied to any electronic circuit configured to enable transmission of signals based on a plurality of asynchronous signals and in which at least one of the asynchronous signals exhibits a high voltage.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A circuit comprising:

test control circuitry configured to selectively transmit one or more electrical test signals between an integrated circuit (IC) and a pad interface based on a plurality of asynchronous electrical supplies, the test control circuitry comprising:

first switching stage circuitry configured to enable electrical flow through the first switching stage circuitry based on a first asynchronous electrical supply comprising a first asynchronous electrical supply voltage;

second switching stage circuitry configured to enable electrical flow through the second switching stage circuitry based on a second asynchronous electrical supply comprising a second asynchronous electrical supply voltage; and intermediate biasing circuitry configured to define an intermediate voltage between the first switching stage circuitry and the second switching stage circuitry, wherein the test control circuitry comprises a plurality of transistors each having a maximum voltage rating, wherein at least one of the plurality of asynchronous electrical supplies exhibits a maximum voltage exceeding the maximum voltage rating of all of the plurality of transistors, and wherein the test control circuitry further comprises protective circuitry configured to ensure a voltage difference across any two terminals of a particular transistor does not exceed a particular maximum voltage rating associated with the particular transistor.

2. The circuit of claim 1, wherein a second maximum voltage of the second asynchronous electrical supply is greater than a first maximum voltage of the first asynchronous electrical supply.

3. The circuit of claim 2, wherein the test control circuitry comprises a maximum voltage rating threshold based at least in part on the maximum voltage rating.

4. The circuit of claim 3, wherein the protective circuitry comprises floating supply circuitry configured to generate a floating supply voltage and floating ground circuitry configured to generate a floating ground voltage, wherein the floating supply voltage and the floating ground voltage are configured to protect one or more biasing transistors comprising the intermediate biasing circuitry.

5. The circuit of claim 4, wherein the floating supply voltage is based at least in part on the second asynchronous electrical supply.

6. The circuit of claim 5, wherein in an instance in which the second asynchronous electrical supply voltage is greater than the maximum voltage rating threshold, the floating supply voltage is between 51% and 55% of the second asynchronous electrical supply voltage.

7. The circuit of claim 5, wherein the intermediate biasing circuitry generates a first intermediate voltage based at least in part on the floating supply voltage.

8. The circuit of claim 4, wherein the floating ground voltage is based at least in part on the second asynchronous electrical supply.

9. The circuit of claim 8, wherein in an instance in which the second asynchronous electrical supply voltage is greater than the maximum voltage rating threshold, the floating ground voltage is between 45% and 49% of the second asynchronous electrical supply voltage.

10. The circuit of claim 8, wherein the intermediate biasing circuitry generates a second intermediate voltage based at least in part on the floating ground voltage.

11. The circuit of claim 4, further comprising floating voltage modifier circuitry configured to generate a modified floating supply voltage and a modified floating ground voltage based at least in part on the floating supply voltage, the floating ground voltage, and a pad interface voltage received at an electrical connection between the test control circuitry and the pad interface.

12. The circuit of claim 11, wherein in an instance in which the first asynchronous electrical supply and the second asynchronous electrical supply are both at or near 0 volts, the modified floating supply voltage is between 51% and 55% of the pad interface voltage, and the modified floating ground voltage is between 45% and 49% of the pad interface voltage.

13. The circuit of claim 12, further comprising:

maximum selector circuitry configured to generate a modified second asynchronous electrical supply based at least in part on the second asynchronous electrical supply voltage, the pad interface voltage, and the modified floating ground voltage.

14. The circuitry of claim 13, wherein the maximum selector circuitry is further configured to generate a modified complementary second asynchronous electrical supply based at least in part on the second asynchronous electrical supply voltage, the pad interface voltage, the modified floating ground voltage, and the modified floating supply voltage.

15. The circuit of claim 14, wherein the second switching stage circuitry includes a first transistor configured to receive the modified second asynchronous electrical supply, and a complement transistor configured to receive the modified complementary second asynchronous electrical supply.

16. The circuit of claim 15, wherein the protective circuitry comprises first stage protection circuitry configured to protect the first transistor of the second switching stage circuitry.

17. The circuit of claim 15, wherein the protective circuitry comprises second stage protection circuitry configured to protect the complement transistor comprising the second switching stage circuitry.

18. The circuit of claim 11, wherein the protective circuitry further comprises level shifting circuitry configured to protect one or more first switching stage transistors comprising the first switching stage circuitry.

19. The circuit of claim 18, wherein the level shifting circuitry is configured to generate a level shifted output voltage based at least in part on the first asynchronous electrical supply voltage and the modified floating supply voltage and wherein the level shifted output voltage is transmitted to the one or more charge protection transistors positioned between the first switching stage circuitry and the intermediate biasing circuitry.

20. An electrical system comprising:

a main board;

a pad interface configured to provide a conductive interface between the main board and an integrated circuit (IC); and test control circuitry configured to selectively transmit one or more electrical test signals between the IC and the pad interface based on a first asynchronous electrical supply and a second asynchronous electrical supply, the test control circuitry comprising:

first switching stage circuitry configured to enable electrical flow through the first switching stage circuitry based on the first asynchronous electrical supply;

second switching stage circuitry configured to enable electrical flow through the second switching stage circuitry based on the second asynchronous electrical supply; and intermediate biasing circuitry configured to define an intermediate voltage between the first switching stage circuitry and the second switching stage circuitry, wherein the test control circuitry comprises a plurality of transistors each having a maximum voltage rating, wherein the second asynchronous electrical supply exhibits a maximum voltage exceeding the maximum voltage rating of all of the plurality of transistors, and wherein the test control circuitry further comprises protective circuitry configured to ensure a voltage difference across any two terminals of a particular transistor does not exceed a particular maximum voltage associated with the particular transistor.

* * * * *